US008593322B2

(12) United States Patent
Ishiyama et al.

(10) Patent No.: US 8,593,322 B2
(45) Date of Patent: Nov. 26, 2013

(54) MICROCOMPUTER, SEMICONDUCTOR DEVICE, AND MICROCOMPUTER APPLIED EQUIPMENT

(75) Inventors: Hiroshi Ishiyama, Kanagawa (JP); Toru Ichien, Kanagawa (JP); Fumiki Kawakami, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 259 days.

(21) Appl. No.: 13/013,990

(22) Filed: Jan. 26, 2011

(65) Prior Publication Data

US 2011/0185238 A1 Jul. 28, 2011

(30) Foreign Application Priority Data

Jan. 26, 2010 (JP) ................................. 2010-014364

(51) Int. Cl.
*H03M 1/12* (2006.01)

(52) U.S. Cl.
USPC .......................................... 341/155; 341/156

(58) Field of Classification Search
USPC .................. 341/155, 120, 166, 156, 164, 172
See application file for complete search history.

(56) References Cited

U.S. PATENT DOCUMENTS

| 6,400,644 | B1 | 6/2002 | Ueno et al. |
| 2002/0064063 | A1 | 5/2002 | Kohara et al. |
| 2009/0237535 | A1* | 9/2009 | Okumura ...................... 348/294 |

FOREIGN PATENT DOCUMENTS

| JP | 2000-156636 A | 6/2000 |
| JP | 2001-093292 A | 4/2001 |
| JP | 2002-165476 A | 6/2002 |

OTHER PUBLICATIONS

Office Action issued Jul. 11, 2013, in Japanese Patent Application No. 2010-014364.

* cited by examiner

*Primary Examiner* — Joseph Lauture
(74) *Attorney, Agent, or Firm* — Miles & Stockbridge P.C.

(57) ABSTRACT

In plural analog circuits that can operate in parallel and are coupled to a common analog power supply terminal, one analog circuit is controlled in the analog operation start according to timing control data that specifies an interval for suppressing the analog operation start of the one analog circuit in the analog operation cycle of the other analog circuit that has already started the analog operation. The control is conducted so that when the operation of one analog circuit starts, timing when the operation of the one analog circuit is influenced by the analog operation start of the other analog circuits in the operation cycle of the one analog circuit is retained as timing control data in advance, and the analog operation start of the other analog circuits is delayed or temporarily suppressed in synchronization with the operation start of the one analog circuit according to the timing control data.

35 Claims, 19 Drawing Sheets

MICROCOMPUTER, SEMICONDUCTOR DEVICE, AND MICROCOMPUTER APPLIED EQUIPMENT

CROSS-REFERENCE TO RELATED APPLICATIONS

The disclosure of Japanese Patent Application No. 2010-14364 filed on Jan. 26, 2010 including the specification, drawings and abstract is incorporated herein by reference in its entirety.

BACKGROUND OF THE INVENTION

The present invention relates to a microcomputer and a semiconductor device each having plural analog circuits which can operate in parallel and microcomputer applied equipment using the same.

Japanese Unexamined Patent Publication No. 2002-165476 discloses a microcomputer that has plural A/D converter circuits mounted on one chip, and can subject plural analog signals to A/D conversion at the same time.

Japanese Unexamined Patent Publication No. 2000-156636 discloses an A/D converter that conducts A/D conversion operation by sequentially switching between outputs of two sample and hold circuits while the respective sample and hold circuits operate in parallel in a state where the operation timing thereof is off, in order to prevent the conversion precision of the A/D converter from being deteriorated. According to the disclosure of Japanese Unexamined Patent Publication No. 2000-156636, the A/D converter can obtain conversion efficiency about twice as high as that when sample and hold operation and conversion operation are conducted merely in series.

SUMMARY OF THE INVENTION

The present inventors have studied such a phenomenon that when the A/D converters mounted on the microcomputer operate asynchronously, noise generated in one A/D converter is propagated to another A/D converter to affect the conversion result, and the conversion precision is greatly deteriorated. According to the study, when the A/D converters are coupled to a common analog power supply terminal, the noise of one A/D converter goes around to another A/D converter through the analog power supply terminal, to thereby relatively largely deteriorate the conversion precision. Further, when the A/D converters start the conversion operation out of synchronization, timing when the noise goes around to another A/D converter from one A/D converter cannot be decided, the deterioration of the conversion precision is not kept constant, and it is difficult to obtain a given effect by an analog circuit countermeasure. For example, a successive approximation type A/D converter opens or closes a switch when an analog input is sampled. Therefore, a relatively large switching noise occurs. Also, an input code of a built-in DAC (local D/A converter) is switched after sampling to obtain the conversion result according to more significant bits. When the input code of the built-in DAC is also switched, the relatively large switching noise occurs. Such a noise greatly affects the conversion operation of, particularly, the less significant bits. It is assumed that the noise propagated through such an analog power channel affects not only the successive approximation type A/D converters but also the other analog circuits. Japanese Unexamined Patent Publication No. 2002-165476 and Japanese Unexamined Patent Publication No. 2000-156636 do not focus on those considerations made by the present inventors.

An object of the present invention is to prevent noise generated in one analog circuit from going around to another analog circuit through an analog power channel.

The above and other objects and novel features of the present invention will become apparent from the description of the present specification and the accompanying drawings.

An outline of a typical aspect of the present invention disclosed in the present application will be described in brief below.

That is, in plural analog circuits that can operate in parallel and are coupled to a common analog power supply terminal, the analog operation start of one analog circuit is controlled on the basis of timing control data that specifies an interval during which the analog operation start of the one analog circuit is suppressed in an analog operation cycle of another analog circuit that has already started the analog operation. In other words, when the operation of one analog circuit starts, timing at which the operation cycle of the one analog circuit is influenced by the analog operation start of another analog circuit is retained as the timing control data in advance, and control is made to delay or temporally suppress the analog operation start of another analog circuit by using the timing control data in synchronization of the operation of one analog circuit.

The advantages obtained by the typical aspect of the present invention disclosed in the present application will be described in brief below.

That is, the noise generated in one analog circuit can be prevented from going around to another analog circuit through the analog power channel.

BRIEF DESCRIPTION OF THE DRAWINGS

FIG. 9 is an explanatory diagram illustrating a specific example of calibration processing;

DETAILED DESCRIPTION OF THE PREFERRED EMBODIMENTS

1. Outlines of Embodiments

Figure 1:
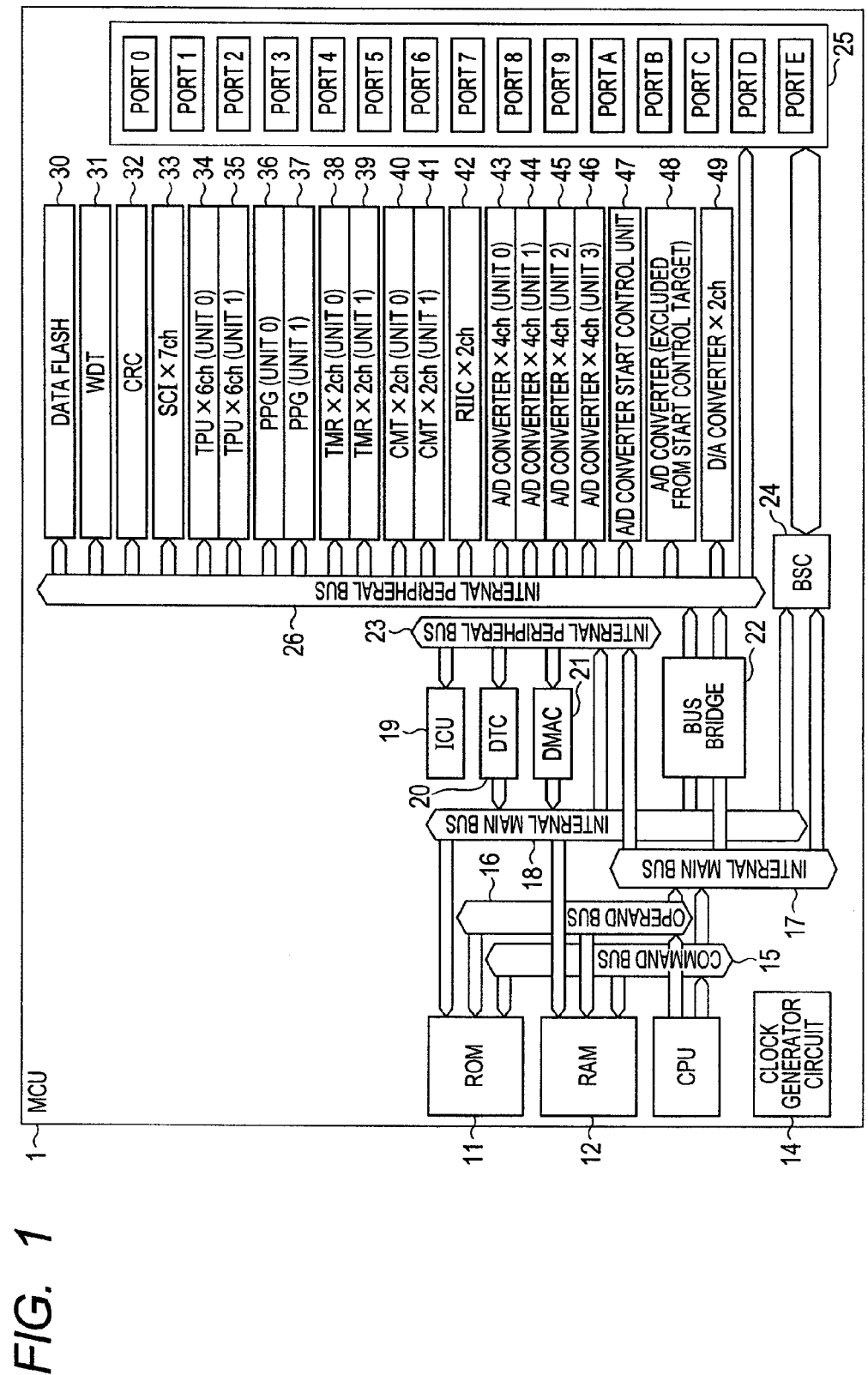
FIG. 1 is a block diagram exemplifying a configuration of a microcomputer according to a first embodiment of the present invention.

First, the outline of typical embodiments of the present invention disclosed in the present application will be described. Reference symbols in the drawings, which are referred to with parentheses in the rough description of the typical embodiments merely exemplify what are included in the concept of components, added with the reference symbols.

[1] <Microcomputer: Start Timing Control of Analog Operation>

A microcomputer (1, 2) according to each of the typical embodiments of the present invention includes analog units (43 to 47, 53 to 56) that receive analog signals and process the analog signals, and processing units (11, 12, and 13). Each of the analog units has plural analog circuits (43 to 46, 53 to 56) that can operate in parallel and are coupled to common analog power supply terminals (AVCC, AVSS). One analog circuit is controlled in the start of the analog operation on the basis of timing control data that specifies an interval during which the analog operation start of the one analog circuit is suppressed in an analog operation cycle of another analog circuit that has already started the analog operation.

The timing control data specifies the timing when the one analog circuit is influenced by the other analog circuits among all of timings at which the other analog circuits start the operation out of synchronization during the operation of one analog circuit. Therefore, the parallel operation mode of the analog circuits having the common analog power supply is determined according to the timing control data with the result that noise generated in one analog circuit that operates out of synchronization can be prevented from going around to another analog circuit through an analog power supply channel. Accordingly, the analog circuit such as the A/D converter which is high in performance but large in noise is easily used without deterioration of the operation precision.

[2] In the computer of the item 1, the analog units have a memory circuit (201, 300) that rewritably retains the timing control data. It is easy to use the timing control data based on the operation mode of the analog circuit.

[3] <Centralized Control of Start Timing>

In the computer (1) of the item 2, the analog units have a timing control circuit (47) that controls the operation start timing of the analog circuits. The timing control circuit receives start request signals of the analog operation for the analog circuits. Then, the timing control circuit determines, on the basis of timing control data (TCDAT), the operation start timing of the other analog circuits responsive to a later start request signal with reference to the operation start timing of an analog circuit that has previously started the operation. This configuration is preferred when the operation start timing of the analog circuit is intensively controlled by the timing control circuit.

[4] <Control by Timer>

In the microcomputer of the item 3, the timing control circuit includes a timer circuit (210 to 212) for discriminating an interval during which the operation start of the analog circuit, which is specified by the timing control data for each operation cycle of the analog circuit that has started the operation, is suppressed, and logic circuits (220 to 222, 230 to 232, 240 to 242) that suppresses the analog operation start responsive to the start request signal of the A/D conversion operation during the interval which has been discriminated by the timer circuit, and cancels the suppression after waiting for the discrimination of deviation from the interval by the timer circuit. In this state, the timing control data specifies the interval during which the operation start of the analog circuit is suppressed by count information measured by the timer circuit.

[5] <Control by State>

In the microcomputer of the item 3, the timing control circuit includes a determination circuit (250 to 252) that identifies an operation state of the analog circuit that has started the operation, and discriminates whether or not the identified operation state coincides with an operation state for suppressing the operation start of the analog circuit specified by the timing control data, and the logic circuits (220 to 222, 230 to 232, and 240 to 242) that suppress the analog operation start responsive to the start request signal of the analog operation during a period in which coincidence has been discriminated, and cancel the suppression after waiting for the discrimination of the nonincidence. In this situation, the timing control data specifies the operation state for suppressing the operation start of the analog circuit. The information on the operation states of the analog circuits can be used to contribute to a reduction in the scale of the timing control circuit.

[6] <Calibration>

In the microcomputer of the item 3, the timing control circuit controls the calibration operation for generating the timing control data. The calibration operation repeats the operation of accumulating errors between a target value and the operation results made by one analog circuit when the operation of the other analog circuits starts after the operation of the one analog circuit has started while sequentially shifting the start timing of the other analog circuits. Then, the calibration operation obtains an interval of the start timing causing a given error according to a relationship between plural errors obtained by the accumulating operation and corresponding start timing. Then, the calibration operation generates timing control data having the obtained interval as an interval for prohibiting the analog operation start, and stores the generated timing control data in the memory circuit. With this configuration, preferred timing control data can be easily obtained for actual equipment to which a microcomputer is applied.

[7] <Decentralized Control of Start Timing>

In the microcomputer (2) of the item 2, the analog circuits include a timing control circuit (63, 64, and 66) that controls the start timing of the analog operation autonomously with reference to the state of the other analog circuits with respect to the start request for the analog operation. The timing control circuit generates and outputs a timing control signal (310, 311, 312) for indicating an interval for prohibiting or permitting the analog operation start of the other analog circuits in the operation cycle of the subject analog circuit during the analog operation thereof. The timing control circuit also conducts control to start the operation of the analog circuit in a limited interval during which the operation start is permitted by each of the timing control signals output by the other analog circuits. According to this configuration, when the number of analog circuits incorporated into the microcomputer is increased or decreased, the circuit portion to be changed in design can be reduced as compared with that in the item 3, thereby making it easy to cope with the function enhancement or change in the microcomputer.

[8] <Control by Timer>

In the microcomputer of the item 7, the timing control data can be set as timer count data for specifying the interval for prohibiting or permitting the analog operation start of the other analog circuits in the analog operation cycle of the subject analog circuit. In this case, the timing control circuit has a timer circuit that starts the timer operation based on the timing control data in response to the analog operation start, and generates a timing control signal indicating the interval for prohibiting or permitting the analog operation start.

[9] <Control by State>

In the microcomputer of the item 7, the timing control data can be set as state identification data for specifying the interval for prohibiting or permitting the analog operation start of the other analog circuits in the analog operation cycle of the subject analog circuit according to the operation state. In this case, the timing control circuit discriminates whether or not the operation start of the analog circuit specified by the timing control data is permitted for each operation state of the analog circuit in response to the analog operation start, and generates the timing control signal indicating the interval for prohibiting or permitting the analog operation start according to the respective discrimination results.

[10] <Calibration>

In the microcomputer of the item 7, the timing control circuit controls the calibration operation for generating the timing control data. The calibration operation repeats the operation of accumulating errors between a target value and the operation results made by the subject analog circuit when the operation of the other analog circuits starts after the operation of the subject analog circuit has started while sequentially shifting the start timing of the other analog circuits. Then, the calibration operation determines the interval for prohibiting the analog operation start on the basis of the interval of the start timing causing a given error according to a relationship between plural errors obtained by the accumulating operation and corresponding start timing, and generates the timing control data. Then, the calibration operation stores the generated timing control data in the memory circuit. With this configuration, preferred timing control data can be easily obtained for actual equipment to which a microcomputer is applied.

[11] <Semiconductor Device; Centralized Control of Start Timing>

A semiconductor device according to an another typical embodiment of the present invention includes plural analog circuits that can operate in parallel and are coupled to a common analog power supply terminal, and a timing control circuit that controls the operation start timing of the analog circuit. The timing control circuit receives a start request signal of the analog operation for the analog circuits, and determines the operation start timing of the other analog circuits due to a later start request signal, with reference to the operation start timing of the analog circuit that has previously started, on the basis of the timing control data.

The timing at which one analog circuit is influenced among all of timing at which the other analog circuits start operation out of synchronization during the operation of one analog circuit is specified by the timing control data. This enables noise generated in one analog circuit that operates out of synchronization to be prevented from going around to the other analog circuits through an analog power supply channel. This configuration is preferable for the centralized control made by the timing control circuit.

[12] <Rewritable Control Data>

The semiconductor device of the item 11 has a memory circuit that rewritably stores the timing control data. It is easy to use the timing control data based on the operation mode of the analog circuit.

[13] <Specification of Operation Start Prohibition Period>

In the semiconductor device of the item 11, the timing control data specifies the interval for prohibiting the analog operation start of the other analog circuits in the analog operation cycle of the analog circuit. In this situation, the timing control circuit suppresses the operation start of the analog circuit responsive to the later start request signal over the interval of prohibition indicated by the corresponding timing control data in the analog operation cycle of the analog circuit that has started in response to the previous start request signal. With this configuration, the parallel operation mode of the analog circuits having the common analog power supply can be determined according to the timing control data.

[14] <Control by Timer>

In the semiconductor device of the item 13, the timing control circuit includes a timer circuit for discriminating the interval for suppressing the operation start of the analog circuit specified by the timing control data for each operation cycle of the analog circuit that has started the operation, and a logic circuit that suppresses the analog operation start responsive to the start request signal of the analog operation in the interval discriminated by the timer circuit, and cancels the suppression after waiting for the discrimination of deviation from the interval by the timer circuit.

[15] In the semiconductor device of the item 14, the timing control data specifies the interval for suppressing the operation start of the analog circuit according to the count information measured by the timer circuit.

[16] <Control by State>

In the semiconductor of the item 13, the timing control circuit includes a determination circuit that identifies the operation state of the analog circuit that has started the operation, and discriminates whether or not the identified operation state coincides with the operation state for suppressing the operation start of the analog circuit specified by the timing control data, and a logic circuit that suppresses the analog operation start responsive to the start request signal of the analog operation in a period where the coincidence has been discriminated, and cancels the suppression after waiting for the discrimination of noncoincidence.

[17] In the semiconductor device of the item 14, the timing control data specifies the operation state for suppressing the operation start of the analog circuit.

[18] <Analog Circuit>

In the semiconductor device of the item 11, each of the analog circuits samples the analog signal, and processes the sampled analog signal.

[19] <Successive Approximation Type A/D Converter>

In the semiconductor device of the item 11, each of the analog circuits is an A/D converter that samples the analog signal, and converts the sampled analog signal into a digital signal.

[20] <Calibration>

In the semiconductor device of the item 12, the timing control circuit controls the calibration operation for generating the timing control data. The calibration operation repeats the operation of accumulating errors between a target value and the operation results made by one analog circuit when the operation of the other analog circuits starts after the operation of the one analog circuit has started while sequentially shifting the start timing of the other analog circuits. Then, the calibration operation obtains an interval of the start timing causing a given error according to a relationship between plural errors obtained by the accumulating operation and corresponding start timing. Then, the calibration operation generates timing control data having the obtained interval as an interval for prohibiting the analog operation start, and stores the generated timing control data in the memory circuit. With this configuration, preferred timing control data can be easily obtained for actual equipment to which a microcomputer is applied.

[21] <Semiconductor Device; Decentralized Control of Start Timing>

A semiconductor device according to still another typical embodiment of the present invention has plural analog circuits that can operate in parallel and are coupled to a common analog power supply terminal. The analog circuits have a timing control circuit that controls the start timing of the analog operation autonomously with reference to the states of the other analog circuits in response to a start request of the analog operation. The timing control circuit generates and outputs a timing control signal for indicating an interval for prohibiting or permitting the analog operation start of the other analog circuits in the operation cycle of the subject analog circuit during the analog operation thereof. The timing control circuit also conducts control to start the operation of the analog circuit in a limited interval during which the operation start is permitted by each of the timing control signals output by the other analog circuits.

The timing control data specifies timing at which one analog circuit undergoes influence among all of timing at which the other analog circuits start operation out of synchronization during the operation of one analog circuit. Therefore, the parallel operation mode of the analog circuits having the common analog power supply is determined according to the timing control data with the result that the noise generated in one analog circuit that operates out of synchronization can be prevented from going around to the other analog circuits through an analog power supply channel. This makes it easy to cope with the function enhancement or change in the semiconductor device.

[22] <Timing Control Data>

The semiconductor device of the item 21 has a memory circuit that rewritably stores the timing control data, and the timing control circuit generates the timing control signal on the basis of the timing control data.

[23] <Control by Timer>

In the semiconductor device of the item 21, the timing control data is timer count data for specifying the interval for prohibiting or permitting the analog operation start of the other analog circuits in the analog operation cycle of the subject analog circuit. In this case, the timing control circuit has a timer circuit that starts timer operation based on the timing control data in response to the analog operation start, and generates a timing control signal indicating the interval for prohibiting or permitting the analog operation start.

[24] <Control by State>

In the semiconductor device of the item 21, the timing control data is state identification data for specifying the interval for prohibiting or permitting the analog operation start of the other analog circuits in the analog operation cycle of the subject analog circuit according to the operation state. In this case, the timing control circuit discriminates whether or not the operation start of the analog circuit specified by the timing control data is permitted for each operation state of the analog circuits in response to the analog operation start, and generates the timing control signal indicating the interval for prohibiting or permitting the analog operation start according to the respective discrimination results.

[25] <Analog Circuit>

In the semiconductor device of the item 21, the analog circuit samples the analog signal, and processes the sampled analog signal.

[26] <Successive Approximation Type A/D Converter>

In the semiconductor device of the item 21, the analog circuit is an A/D converter that samples the analog signal, and converts the sampled analog signal into a digital signal.

[27] <Calibration>

In the semiconductor device of the item 22, the timing control circuit controls the calibration operation for generating the timing control data. The calibration operation repeats the operation of accumulating errors between a target value and the operation results made by the subject analog circuit when the operation of the other analog circuits starts after the operation of the subject analog circuit has started while sequentially shifting the start timing of the other analog circuits. Then, the calibration operation determines the interval for prohibiting the analog operation start on the basis of the interval of the start timing causing a given error according to a relationship between plural errors obtained by the accumulating operation and corresponding start timing to generate the timing control data. Then, the calibration operation stores the generated timing control data in the memory circuit. With this configuration, preferred timing control data can be easily obtained for actual equipment to which a microcomputer is applied.

[28] <Microcomputer Applied Equipment>

Microcomputer applied equipment (400) according to still another typical embodiment of the present invention includes a microcomputer (1, 2), and target equipment (407, 408) controlled by the microcomputer. The microcomputer includes A/D conversion units (43 to 46, 53 to 56) that input analog signals from the target equipment (407, 408) and convert the analog signals into digital signals, and processing units (11, 12, 1, 3) that control the target equipment by using the conversion results by the A/D conversion units. Each of the A/D conversion units includes plural A/D converter circuits that can operate in parallel, and are coupled to a common analog power supply terminal. One A/D converter circuit is controlled in the A/D conversion operation start on the basis of timing control data that specifies an interval for suppressing the conversion operation start of the one A/D conversion circuit in the conversion operation cycle of the other A/D conversion circuits that have already started the A/D conversion operation. The A/D conversion units have a memory circuit that rewritably retains the timing control data.

The timing control data specifies timing at which one A/D converter circuit undergoes influence among all of timing at which the other A/D converter circuits start operation out of synchronization during the operation of one analog circuit. Therefore, the parallel operation mode of the A/D converter circuits having the common analog power supply is determined according to the timing control data with the result that the noise generated in one A/D converter circuit that operates out of synchronization can be prevented from going around to the other analog circuits through an analog power supply channel.

[29] <Centralized Control of Start Timing>

In the computer applied equipment of the item 28, the A/D conversion units include a timing control circuit that controls the operation start timing of the A/D converter circuits. The timing control circuit receives start request signals of the A/D conversion operation for the A/D converter circuits, and determines the operation start timing of the other A/D converter circuits responsive to a later start request signal with reference to the operation start timing of the A/D converter circuit that has started in advance on the basis of the timing control data. This configuration is suitable for a case in which the operation start timing of the A/D converter circuits is intensively controlled by the timing control circuit.

[30] <Control by Timer>

In the microcomputer applied equipment of the item 29, the timing control circuit includes a timer circuit for discriminating the interval for suppressing the operation start of the A/D converter circuit specified by the timing control data for each operation cycle of the A/D converter circuit that has started the operation, and a logic circuit that suppresses the A/D conversion operation start responsive to the start request signal of the A/D conversion operation in the interval discriminated by the timer circuit, and cancels the suppression after waiting for the discrimination of deviation from the interval by the timer circuit. In this case, the timing control data specifies the interval for suppressing the operation start of the A/D converter circuits by count information measured by the timer circuit.

[31] <Control by State>

In the computer applied equipment of the item 29, the timing control circuit includes a determination circuit that identifies the operation state of the A/D converter circuit that has started the operation, and discriminates whether or not the identified operation state coincides with the operation state for suppressing the operation start of the A/D converter circuit specified by the timing control data, and a logic circuit that suppresses the A/D conversion operation start responsive to the start request signal of the A/D conversion operation in a period where the coincidence has been discriminated, and cancels the suppression after waiting for the discrimination of noncoincidence. In this case, the timing control data specifies the operation state for suppressing the operation start of the A/D converter circuit.

[32] <Calibration>

In the microcomputer applied equipment of the item 29, the timing control circuit controls the calibration operation for generating the timing control data. The calibration operation repeats the operation of accumulating errors between a target value and the operation results made by one A/D converter circuit when the operation of the other analog circuits starts after the operation of the one A/D converter circuit has started while sequentially shifting the start timing of the other A/D converter circuits. Then, the calibration operation obtains an interval of the start timing causing a given error according to a relationship between plural errors obtained by the accumulating operation and corresponding start timing. Then, the calibration operation generates timing control data having the obtained interval as an interval for prohibiting the A/D conversion operation start, and stores the generated timing control data in the memory circuit. With this configuration, preferred timing control data can be easily obtained for actual equipment to which a microcomputer is applied.

[33] <Decentralized Control of Start Timing>

In the microcomputer applied equipment of the item 28, the A/D converter circuits includes a timing control circuit that controls the start timing of the A/D conversion operation autonomously with reference to the state of the other A/D converter circuits in response to the start request for the A/D conversion operation. In this case, the timing control circuit generates and outputs a timing control signal for indicating an interval for prohibiting or permitting the A/D conversion operation start of the other A/D converter circuits in the operation cycle of the subject A/D converter circuit during the A/D conversion operation thereof. The timing control circuit also conducts control to start the operation of the A/D converter circuit in a limited interval during which the operation start is permitted by each of the timing control signals output by the other analog circuits. According to this configuration, it is easy to cope with the function enhancement or change in the microcomputer.

[34] <Timer Control>

In the microcomputer applied equipment of the item 33, the timing control data is timer count data for specifying the interval for prohibiting or permitting the A/D conversion operation start of the other A/D converter circuits in the A/D conversion operation cycle of the subject A/D converter circuit. In this case, the timing control circuit has a timer circuit that starts timer operation based on the timing control data in response to the A/D conversion operation start, and generates a timing control signal indicating the interval for prohibiting or permitting the A/D conversion operation start.

[35] <Control by State>

In the microcomputer applied equipment of the item 33, the timing control data is state identification data for specifying the interval for prohibiting or permitting the A/D conversion operation start of the other A/D converter circuits in the A/D conversion operation cycle of the subject A/D converter circuit according to the operation state. In this case, the timing control circuit discriminates whether or not the operation start of the A/D converter circuit specified by the timing control data is permitted, for each operation state of the A/D converter circuits in response to the A/D conversion operation start, and generates the timing control signal indicating the interval for prohibiting or permitting the A/D conversion operation start according to the respective discrimination results.

[36] <Calibration>

In the microcomputer applied equipment of the item 33, the timing control circuit controls the calibration operation for generating the timing control data. The calibration operation repeats the operation of accumulating errors between a target value and the operation results made by the subject A/D converter circuit when the operation of the other A/D converter circuits starts after the operation of the subject A/D converter circuit has started while sequentially shifting the start timing of the other A/D converter circuits. Then, the calibration operation determines an interval for prohibiting the A/D conversion operation start on the basis of the interval of the start timing causing a given error according to a relationship between plural errors obtained by the accumulating operation and corresponding start timing to generate the timing control data. Then, the calibration operation stores the generated timing control data in the memory circuit. With this configuration, preferred timing control data can be easily obtained for actual equipment to which a microcomputer is applied.

2. Details of Embodiments

Embodiments will be described in more detail.

Embodiment 1

Microcomputer

FIG. 1 exemplifies the configuration of a microcomputer according to Embodiment 1. Although not particularly limited, a microcomputer (MCU) 1 illustrated in FIG. 1 is formed on one semiconductor substrate such as a single crystal silicon as a semiconductor device through a semiconductor process technology for a complementary MOS integrated circuit or the like.

The microcomputer 1 includes a ROM 11 that stores program or the like therein, a CPU 13 that executes the program, and a RAM 12 that is used as a work region for the CPU 13 or the like as a processing unit such as a CPU core. The processing unit has a command bus 15 and an operant bus 16, separately. A clock signal generated in a clock generator circuit 14 is used for the internal synchronous operation of the microcomputer 1.

The processing unit is interfaced to internal main buses 17 and 18. For example, the internal main bus 17 is coupled to a port 25 through an external bus controller (BSC) 24, interfaced to an internal peripheral bus 26 through a bus bridge 22, and also interfaced to an internal peripheral bus 23. The internal main bus 18 is also interfaced to the internal peripheral bus 26 through the bus bridge 22, coupled to the port 25 through the external bus controller (BSC) 24, and also interfaced to the internal peripheral bus 23. An interrupt controller (ICU) 19, a data transfer controller (DTC) 20, and a direct memory access controller (DMAC) 21 are arranged between the internal main bus 18 and the internal peripheral bus 23.

The internal peripheral bus 26 is coupled with, for example, a data flash 30 that is a nonvolatile memory which can electrically rewrite data, a watch dog timer (WDT) 31, a cyclic redundancy check (CRC) arithmetic unit 32, a serial communication interface (SCI) 33, 16-timer pulse units (TPU) 34 and 35, programmable pulse generators (PPG) 36 and 37, 8-bit timers (TMR) 38 and 39, compare match timers (CMT) 40 and 41, and an IIC bus interface (RIIC) 42, and their operation is controlled according to initialization by the CPU 13 or the like.

Further, the microcomputer 1 includes, as analog circuits, for example, A/D converters 43 to 46 and another A/D converter 48 which receive respective analog signals coupled to the internal peripheral bus 26 and convert the input digital signals into respective analog signals, and a D/A converter 49 that receives a digital signal and converts the input digital signal into an analog signal. The A/D converters 43 to 46 are circuits that can operate in parallel, and an A/D converter start control unit 47 functioning as a timing control circuit that executes timing control for mutually relieving influences of noise due to the respective A/D conversion operation is coupled to the internal peripheral bus 26, likewise. The A/D converter start control unit 47 executes control on the basis of the initialization by the CPU 13. The A/D converter 48 does not operate in parallel to the A/D converters 43 to 46, and therefore is excluded from targets controlled by the A/D converter start control unit 47. In Embodiment 1, the A/D converter start control unit 47 intensively controls the four A/D converters 43 to 46.

<<A/D Conversion Start Timing Control>>

Figure 2:
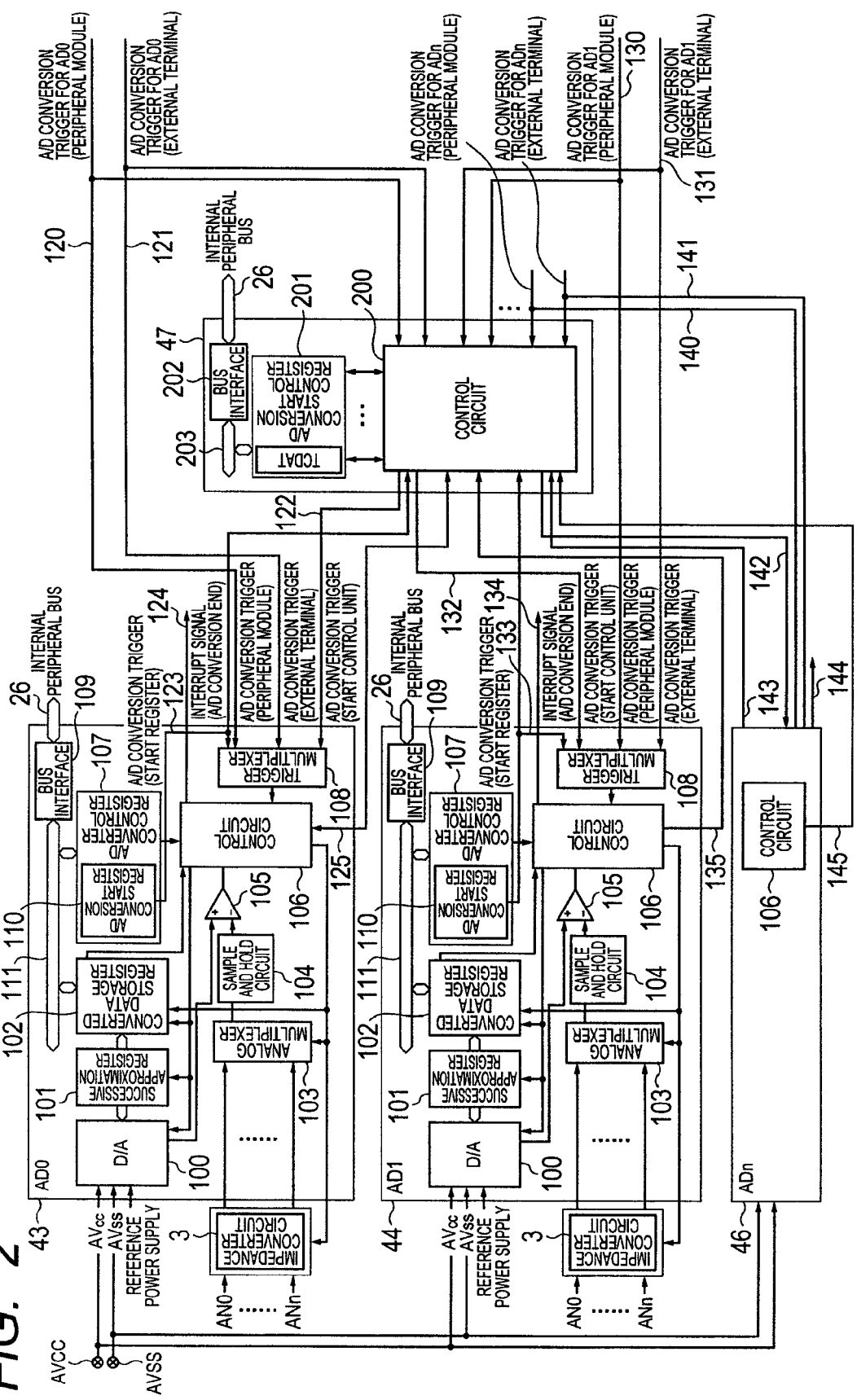
FIG. 2 is a block diagram exemplifying a configuration for operation start timing control of an A/D converter by an A/D converter start control unit in the microcomputer of FIG. 1.

FIG. 2 exemplifies a configuration for operation start timing of the A/D converters 43 to 46 by the A/D converter start control unit 47 in the microcomputer 1. Although not particularly limited, for facilitation of understanding the following description, it is assumed that three A/D converters 43, 44, and 46 are essentially provided.

The A/D converter start control unit 47 receives start request signals 120, 121, 130, 131, 140, and 141 for the A/D conversion operation of the A/D converters 43, 44, and 46. The A/D converter start control unit 47 then determines operation start timing for the other A/D converters responsive to signals 122, 132, and 142 for the other A/D converters due to later start request signals on the basis of timing control data (TCDAT) with reference to the operation start timing of the A/D converter that has started previously. As a result, one A/D converter is controlled in the A/D conversion operation start on the basis of the timing control data (TCDAT) that specifies the interval for suppressing the analog operation start of the one A/D converter in an analog operation cycle of the other A/D converter that has already started the A/D conversion operation. The detailed configuration for this control will be further described.

The A/D converters 43, 44, and 46 are coupled to common analog power supply terminals AVCC and AVSS, and an analog power supply voltage AVCC and an analog ground voltage AVSS are applied to those A/D converters 43, 44, and 46.

Although being not limited, the A/D converter 43 has a successive approximation type configuration. For example, analog input voltages AN0 to Ann are applied to a multiplexer 103 through an impedance converter circuit 3, and the selected analog input voltage is held by a sample and hold circuit 104. In order to discriminate the sampled and held voltage (sample and hold voltage), a local D/A converter circuit 100 is provided. The operation of converting a digital value held by a successive approximation register 101 by the local D/A converter circuit 100, comparing the conversion result with the sample and hold voltage by a comparator 105, and determining corresponding bits of the successive approximation register 101 according to the comparison result by a control circuit 106 is successively conducted from the most significant bit to the least significant bit. Data finally obtained in the successive approximation register 101 is held in a converted data storage register 102 as the conversion result. The control circuit 106 controls the sample and hold operation of the sample and hold voltage and the comparison operation of the successive approximation. The operation control is conducted by the CPU 13 according to various control data set in an A/D conversion control register 107. The converted data storage register 102 and the A/D conversion control register 107 are interfaced to the internal peripheral bus 26 through a module data bus 111 and a bus interface 109.

The A/D conversion operation is instructed according to the A/D conversion trigger signals 120, 121, 122, and 123 as the start request signals. An A/D converter trigger multiplexer 108 selects any one trigger signal to be used according to a setting value of the A/D converter control register 107. The start trigger signal 123 is generated according to the setting of a conversion enable bit of the A/D conversion start register 110. When the conversion trigger signal 120, 121, or 123 is selected by the A/D converter trigger multiplexer 108, the A/D conversion operation directly starts by enabling the trigger signal without being subjected to the timing control by the A/D converter start control unit 47. This is significant when the A/D conversion operation must start immediately with avoiding an operation delay time caused by the control of the A/D converter start control unit 47, when a state in which only one of the A/D converters 43, 44, and 46 operates can be ensured, or when the A/D converters 43, 44, and 46 operate in synchronization.

Reference numeral 124 is an interrupt signal for notifying a start request source of the A/D conversion of the completion of the A/D conversion operation by the A/D converter 43. The A/D converters 44 and 46 have different reference numerals 134 and 144, respectively. Reference numeral 125 generically denotes a signal for notifying the A/D converter start control unit 47 of the sample and hold operation start of the A/D converter 43 and the successive approximation operation end subsequent to the operation start. The A/D converters 44 and 46 have different reference numerals 135 and 145, respectively.

Since the other A/D converters 44 to 46 are also configured in the same manner as that of the A/D converter 43, their detailed description will be omitted. A difference resides in that different conversion trigger signals of the A/D conversion are supplied to the respective A/D converters 44 and 46. For example, conversion trigger signals 130, 131, 132, and 133 are supplied to the A/D converter 44, and conversion trigger signals 140, 141, and 142 are supplied to the A/D converter 46 from the external.

The A/D converter start control unit 47 has a control circuit 200 and an A/D conversion start control register 201. The A/D conversion start control register 201 is coupled to the internal peripheral bus 26 through a module data bus 203 and a bus interface 202, and control data is set by the CPU 13. The control data includes the timing control data TCDAT.

The control circuit 200 receives the A/D conversion trigger signals 120, 121, 123, 130, 131, 132, 140, 141, and 143, and signals 125, 135, and 145, and outputs the A/D conversion trigger signals 122, 132, and 142 to the A/D converters 43, 44, and 46 on the basis of the timing control data TCDAT.

<<Timing Control by Timer Counter>>

Figure 3:
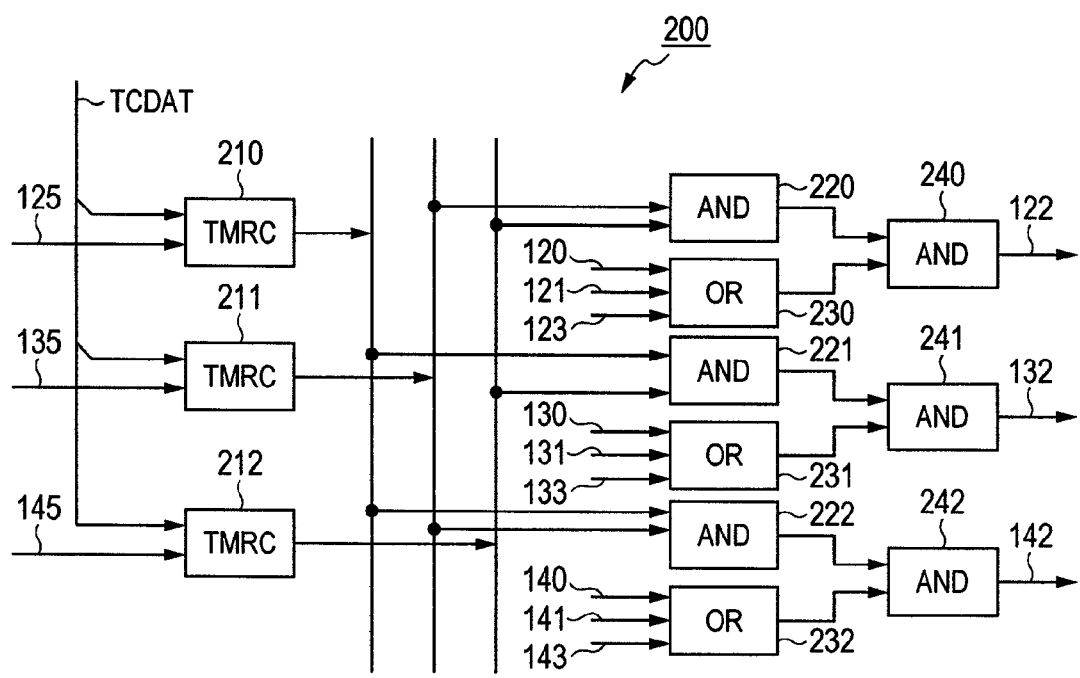
FIG. 3 is a logic circuit diagram illustrating an example of a control circuit in the A/D converter start control unit.
Figure 4:
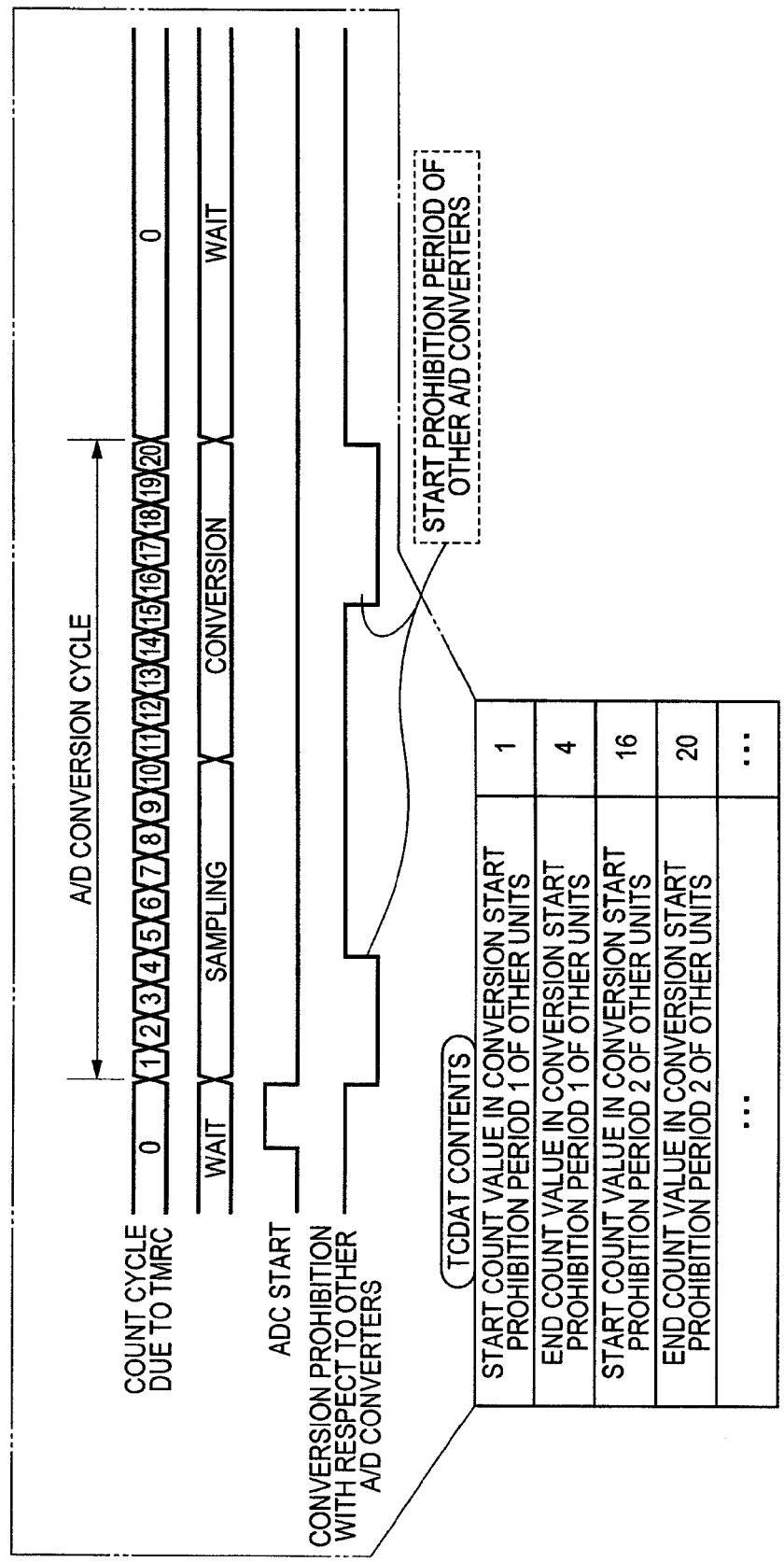
FIG. 4 is an explanatory diagram illustrating an example of timing control data TCDAT.

FIG. 3 illustrates one example of the control circuit 200. Timer counters (TMRC) 210, 211, and 212 are disposed for the A/D converters 43, 44, and 46, respectively. The timing control data TCDAT is preset in the timer counters 210, 211, and 212. The timing control data TCDAT may be provided for the A/D converters 43, 44, and 46, commonly or individually. The timing control data TCDAT is data for specifying the interval during which the A/D conversion operation is indispensably affected by noise propagated through the analog power supply channel when the A/D conversion operation of the other A/D converters starts during an A/D conversion cycle, for example, when the A/D conversion cycle including sampling of the A/D converters and conversion caused by successive approximation is made to correspond to count cycles of 1 to 20. For example, in an example of FIG. 4, the timing control data TCDAT is data for designating the count cycles 1 to 4 and the count cycles 16 to 20.

The timer counter 210 in which the timing control data TCDAT has been preset starts the timer counter operation from a value 0 when the A/D conversion cycle starts according to the signal 125, and forms a timer output signal of a waveform which is made at a low level in the interval of the timer count value designated by the timing control data TCDAT. The timer counter 210 then returns the timer count value to a value 0, and stops the timer counter operation upon receiving an instruction for terminating the A/D conversion cycle according to the signal 125. The other timer counters 211 and 212 operate in the same manner on the basis of the signals 135 and 145. Accordingly, the outputs of the respective timer counters 210, 211, and 212 prohibit the operation of the other A/D converters in the period of the low level.

An AND gate 220 performs the AND operation between the outputs of the timer counters 211 and 212, an AND gate 221 performs the AND operation between the outputs of the timer counters 210 and 212, and an AND gate 222 performs the AND operation between the outputs of the timer counters 210 and 211. The output of the AND gate 220 permits the A/D conversion operation start of the A/D converter 43 by the high level in association with the A/D conversion operation of the A/D converters 44 and 46. Likewise, the output of the AND gate 221 permits the A/D conversion operation start of the A/D converter 44 by the high level in association with the A/D conversion operation of the A/D converters 43 and 46. The output of the AND gate 222 permits the A/D conversion operation start of the A/D converter 46 by the high level in association with the A/D conversion operation of the A/D converters 43 and 44.

An OR gate 230 performs the OR operation of the conversion trigger signals 120, 121, and 123. The ORed signal and the ANDed signal of the AND gate 220 are ANDed by an AND gate 240, and the ANDed result is supplied to the A/D converter 43 as the conversion trigger signal 122. Accordingly, when the A/D conversion is requested by any one of the conversion trigger signals 120, 121, and 123, the conversion trigger signal 122 is set in a conversion enable state at timing when noise indispensable in the operation of the other A/D converters 44 and 46 is not generated. Likewise, an OR gate 231 performs the OR operation of the conversion trigger signals 130, 131, and 133. The ORed signal and the ANDed signal of the AND gate 221 are ANDed by an AND gate 241, and the ANDed result is supplied to the A/D converter 44 as the conversion trigger signal 132. Accordingly, when the A/D conversion is requested by any one of the conversion trigger signals 130, 131, and 133, the conversion trigger signal 132 is set in the conversion enable state at timing when noise indispensable in the operation of the other A/D converters 43 and 46 is not generated. Also, an OR gate 232 performs the OR operation of the conversion trigger signals 140, 141, and 143. The ORed signal and the ANDed signal of the AND gate 222 are ANDed by an AND gate 242, and the ANDed result is supplied to the A/D converter 46 as the conversion trigger signal 142. Accordingly, when the A/D conversion is requested by any one of the conversion trigger signals 140, 141, and 143, the conversion trigger signal 142 is set in the conversion enable state at timing when noise indispensable in the operation of the other A/D converters 43 and 44 is not generated.

Figure 5:
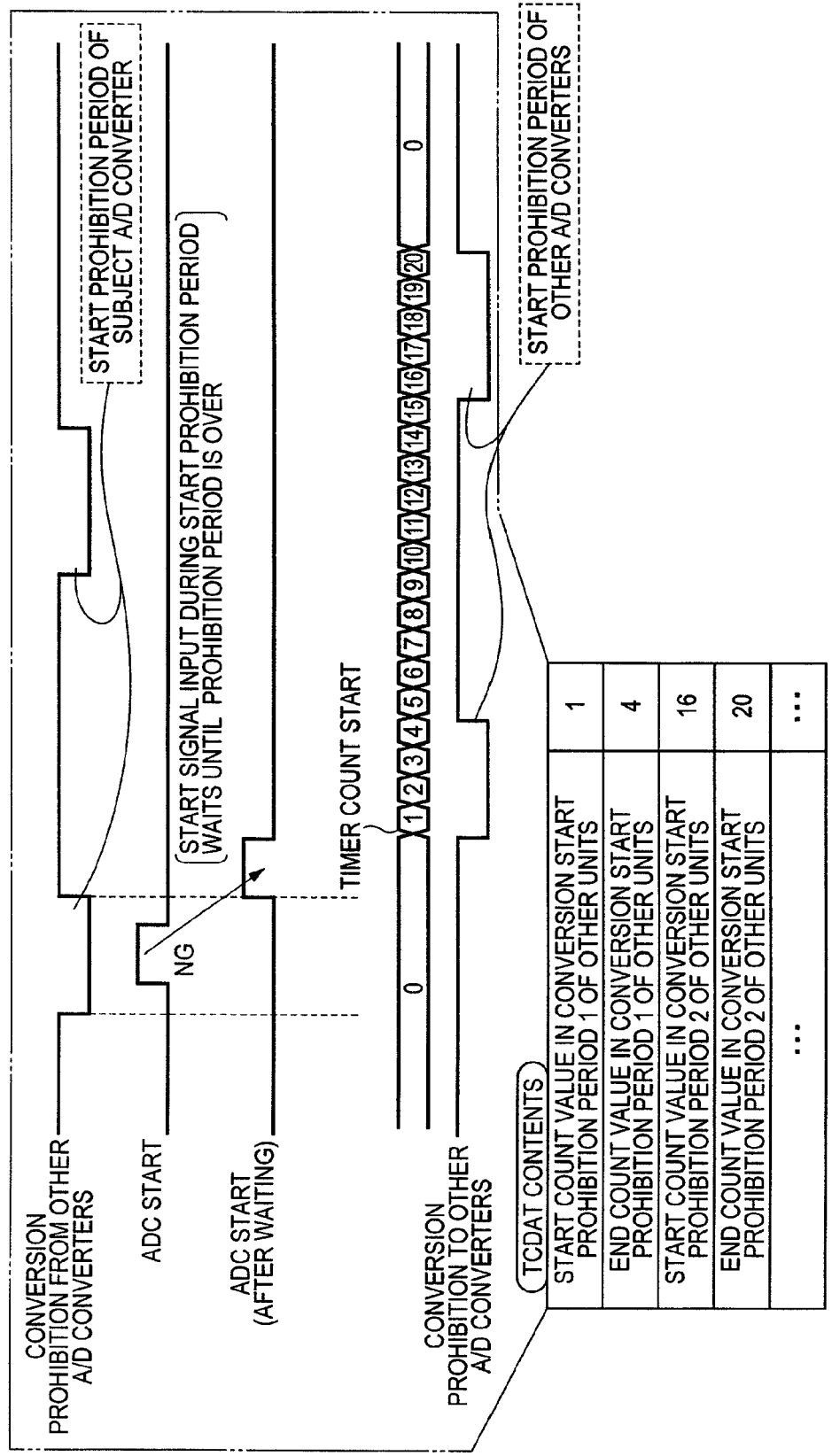
FIG. 5 is a timing chart exemplifying the operation when the operation start of the subject A/D converter is suppressed during the operation of another A/D converter.
Figure 6:
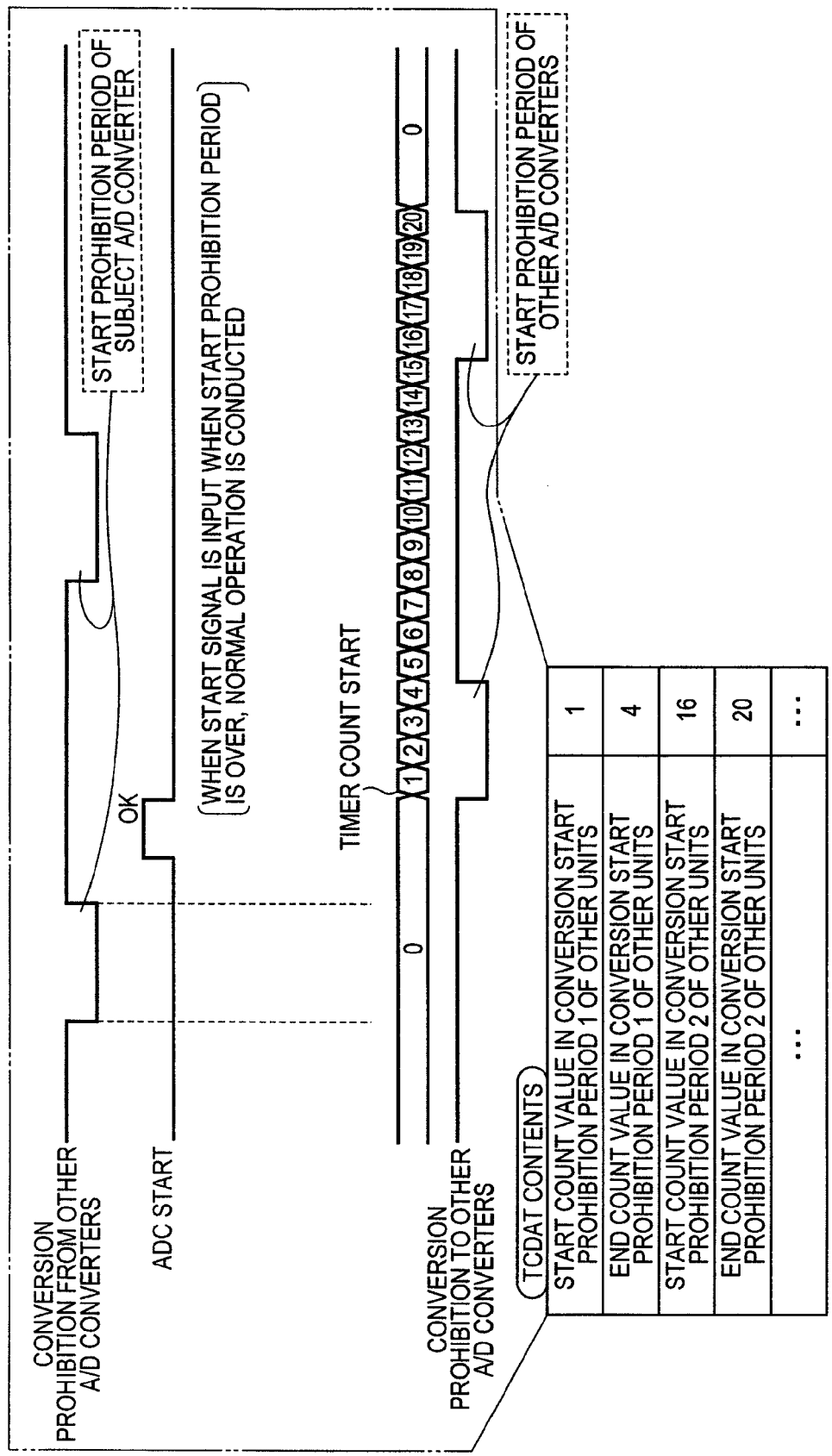
FIG. 6 is a timing chart showing the operation when the operation start of the subject A/D converter is supplied to the converter start control unit at the timing when a prohibition period is off.
Figure 7:
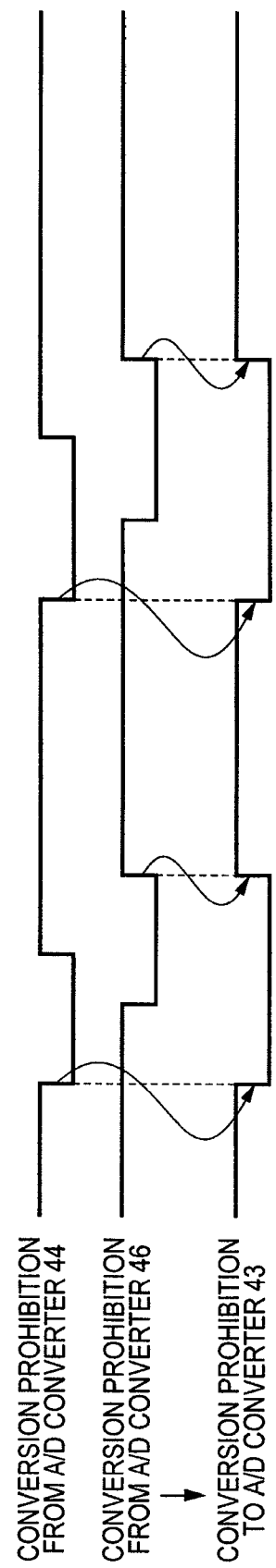
FIG. 7 is a timing chart showing the operation when the conversion start timing of the subject A/D converter is delayed according to a conversion prohibition request for other plural A/D converters.

FIG. 5 exemplifies the operation when the operation start of the subject A/D converter is suppressed during the operation of the other A/D converters. Even if the operation start of the subject A/D converter is supplied to the converter start control unit 47 during a period when the A/D conversion operation start is prohibited for the operation of the other A/D converters, the conversion start of the subject A/D converter is permitted after waiting for the elapse of the prohibition period. As shown in FIG. 6, when the operation start of the subject A/D converter is supplied to the converter start control unit 47 at timing out of the prohibition period, the conversion start of the subject A/D converter is permitted without waiting. FIG. 7 exemplifies the operation when the conversion start timing of the subject A/D converter is delayed according to the conversion prohibition request related to the other A/D converters. In FIG. 7, a signal corresponding to the conversion prohibition from the A/D converter 44 corresponds to the output of the timer counter 211 in FIG. 3. A signal corresponding to the conversion prohibition from the A/D converter 46 corresponds to the output of the timer counter 212, and the conversion prohibition to the D/A converter 43 corresponds to the output of the AND gate 220.

<<Timing Control by A/D Conversion State>>

The timing control of the A/D conversion start is not limited to a case using the timer counter, but can be executed by using the A/D conversion state.

Figure 8:
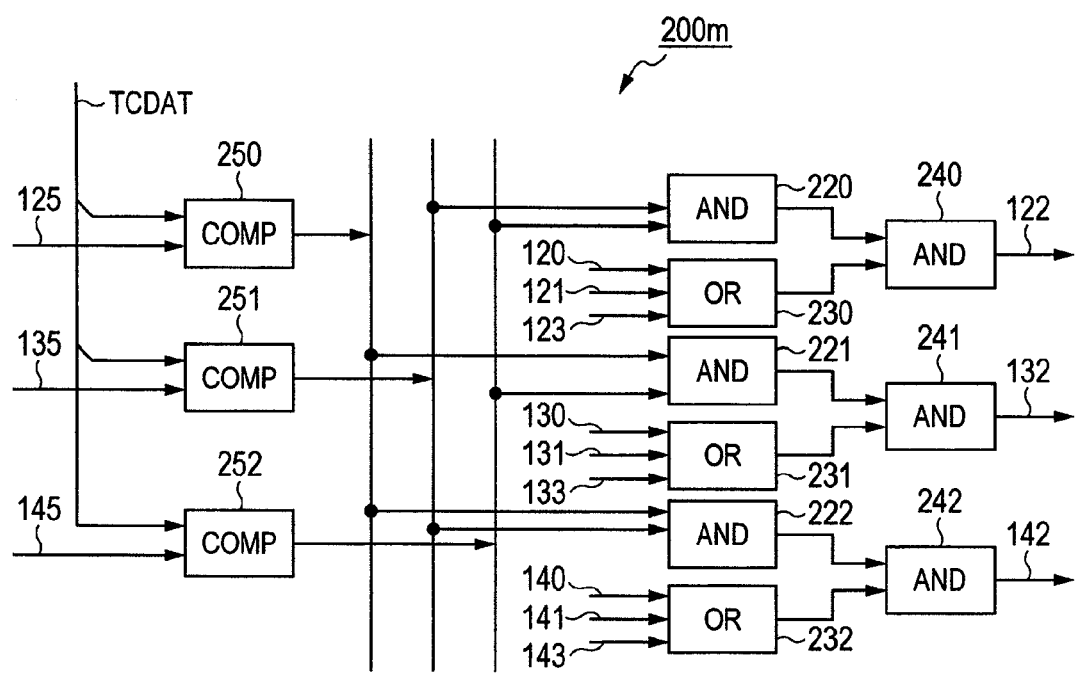
FIG. 8 is a logic circuit diagram illustrating a configuration in which an A/D conversion state is used for a control circuit in an A/D converter start control unit.

FIG. 8 exemplifies a control circuit 200m using the A/D conversion state. In this case, the timer counters 210, 211, and 212 of FIG. 3 are replaced with comparators (COMP) 250, 251, and 252. The timing control data TCDAT holds state Nos. of the A/D conversion states instead of the count value from the timer counter. The A/D conversion state is information representing the internal operation of the sampling and the successive conversion in the A/D conversion cycle, or the transition state of the internal control. The A/D conversion state is represented by state Nos. of, for example, 0 to 20. The comparators 250, 251, and 252 compare the state Nos. supplied as the signals 125, 135, and 145 from the corresponding A/D converters 43, 44, and 46 with the state Nos. of the timing control data, respectively, and each produce a comparison result signal of the waveform that is made at the low level in the matched state. The other configurations are identical with those in FIG. 3, and the detailed description will be omitted. Similarly, in the case of applying the timing control by the A/D conversion state, the same advantages as those in the case of using the timer counter are obtained.

<<Calibration>>

The timing control data can be generated by simulation with the use of a microcomputer and the design data of the A/D converters. In this embodiment, the timing control circuit 47 has a function of controlling the calibration operation for generating the timing control data. The calibration operation repeats the operation of accumulating errors between a target value and the operation results made by one A/D converter when the operation of the other A/D converters starts after the operation of the one analog circuit has started while sequentially shifting the start timing of the other A/D converters. Then, the calibration operation obtains an interval of the start timing causing a given error according to a relationship between plural errors obtained by the accumulating operation and corresponding start timing. Then, the calibration operation generates timing control data having the obtained interval as an interval for prohibiting the A/D conversion operation start. It should be understood that instruction signals for the successive A/D conversion operation to the A/D converters 43, 44, and 46 by the control circuit 200, and the result signals of the A/D conversion operation are included in parts of the generic signals 125, 135, and 145.

Figure 9:
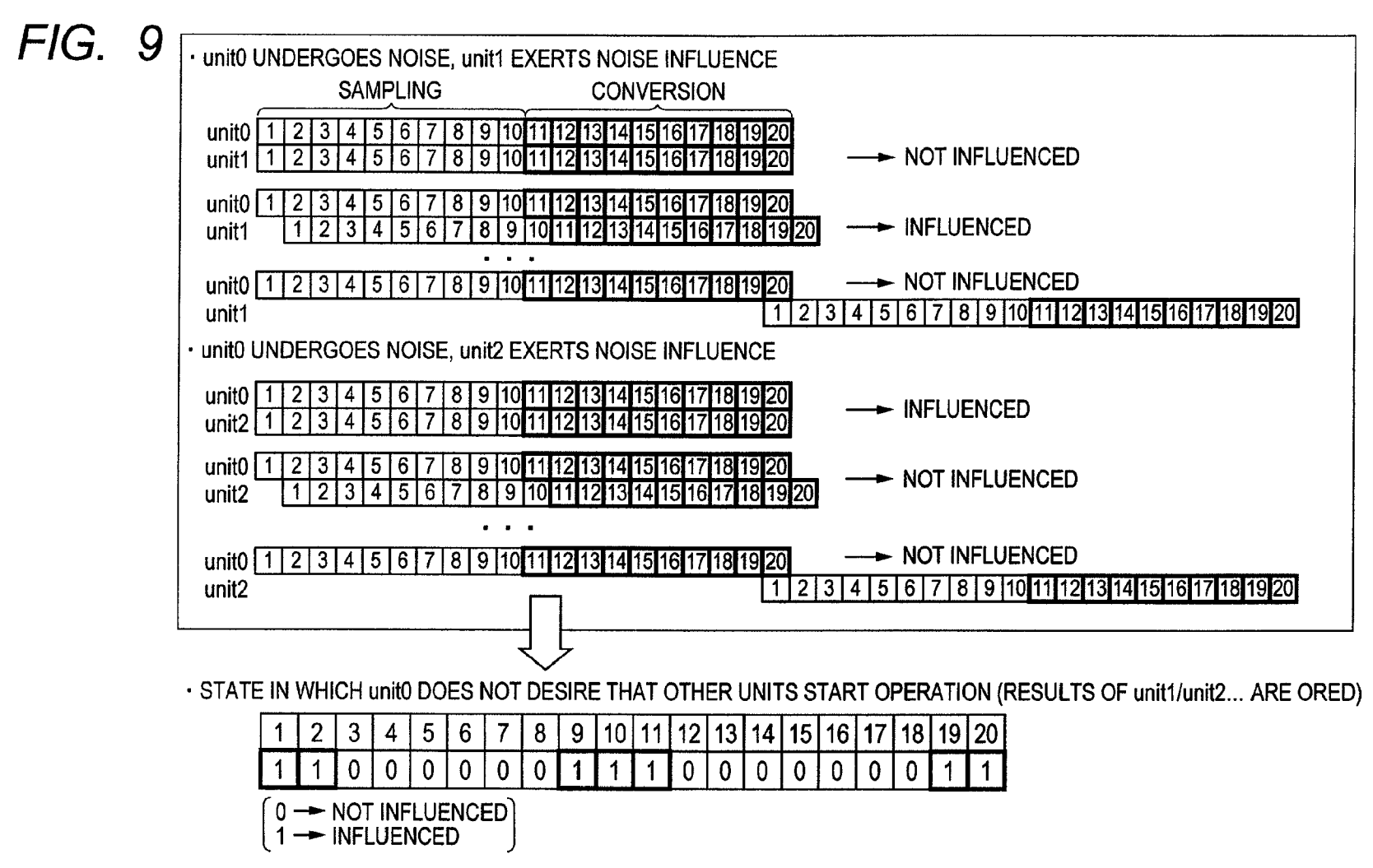

The above operation will be described in more detail with reference to FIG. 9. When an influence on the A/D converter 43 (unit 0) that is operating is considered, an influence of the A/D converter 44 (unit 1), an influence of the A/D converter 45 (unit 2), and an influence of the A/D converter 46 are obtained, respectively, and their obtained results are then synthesized. For example, when the A/D converter 43 (unit 0) operates, an influence when the operation of the A/D converter 44 (unit 1) starts at the same timing, an influence when the operation of the A/D converter 44 starts at timing where the timer count state (or the conversion state) is shifted by one, an influence when the operation of the A/D converter 44 starts at timing where the timer count state (or the conversion state) is shifted by two, and influences when the operation of the A/D converter 44 starts while the timer count state (or the conversion state) is shifted in the same manner until the shift of timing becomes maximum are obtained, respectively.

Then, an influence of the operation of another A/D converter 45 (unit 2) on the A/D converter 43 (unit 0) is obtained, and an influence of the operation of another A/D converter 46 on the A/D converter 43 is finally obtained. Those results are ORed to obtain the timing control data for the A/D converter 43 (unit 0). When modes in which the respective A/D converters 43, 44, 45, and 46 are influenced by the other A/D converters are different from each other, the influences of the other A/D converters on the respective A/D converters 43, 44, 45, and 46 are measured to generate the individual timing control data for each of the A/D converters.

The generated timing control data is stored in an A/D conversion start control register 210. It is desirable that the A/D conversion start control register 210 is configured by an electrically rewritable nonvolatile memory such a flash memory. Efforts that the calibration processing is repeated for each power off are omitted.

Figure 10:
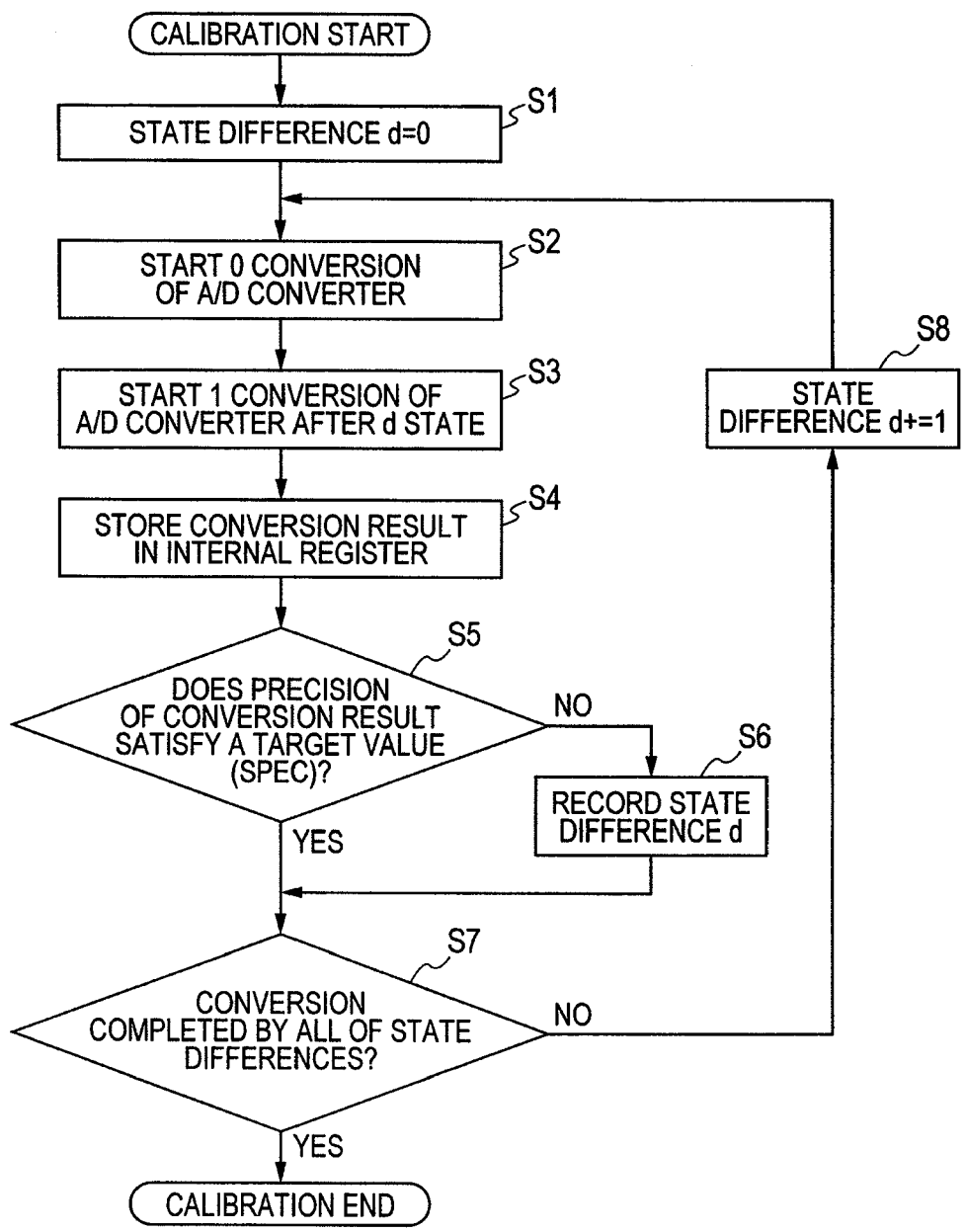
FIG. 10 is a flowchart showing the calibration processing.

FIG. 10 shows a flowchart of the calibration operation. A state difference of the timer count state (or the conversion state) is set as 0 (d=0) (S1), the conversion operation of the A/D converter 0 starts (S2), and the conversion operation of the A/D converter 1 starts after a d-state (S3). The conversion result of the A/D converter 0 is stored in a work region (S4). It is discriminated whether or not a precision in the conversion result satisfies a target value (S5). If the precision does not satisfy the target value, a state difference d at that time is recorded (S6). If the precision satisfies the target value, the state difference is updated to d=d+1 (S7, S8), the above steps are repeated, and the above processing is executed until the conversion has been completed in all of the state differences.

The microcomputer 1 has the above calibration control function with the result that the timing control data suitable for actual equipment to which a microcomputer is applied can be easily acquired.

Figure 11:
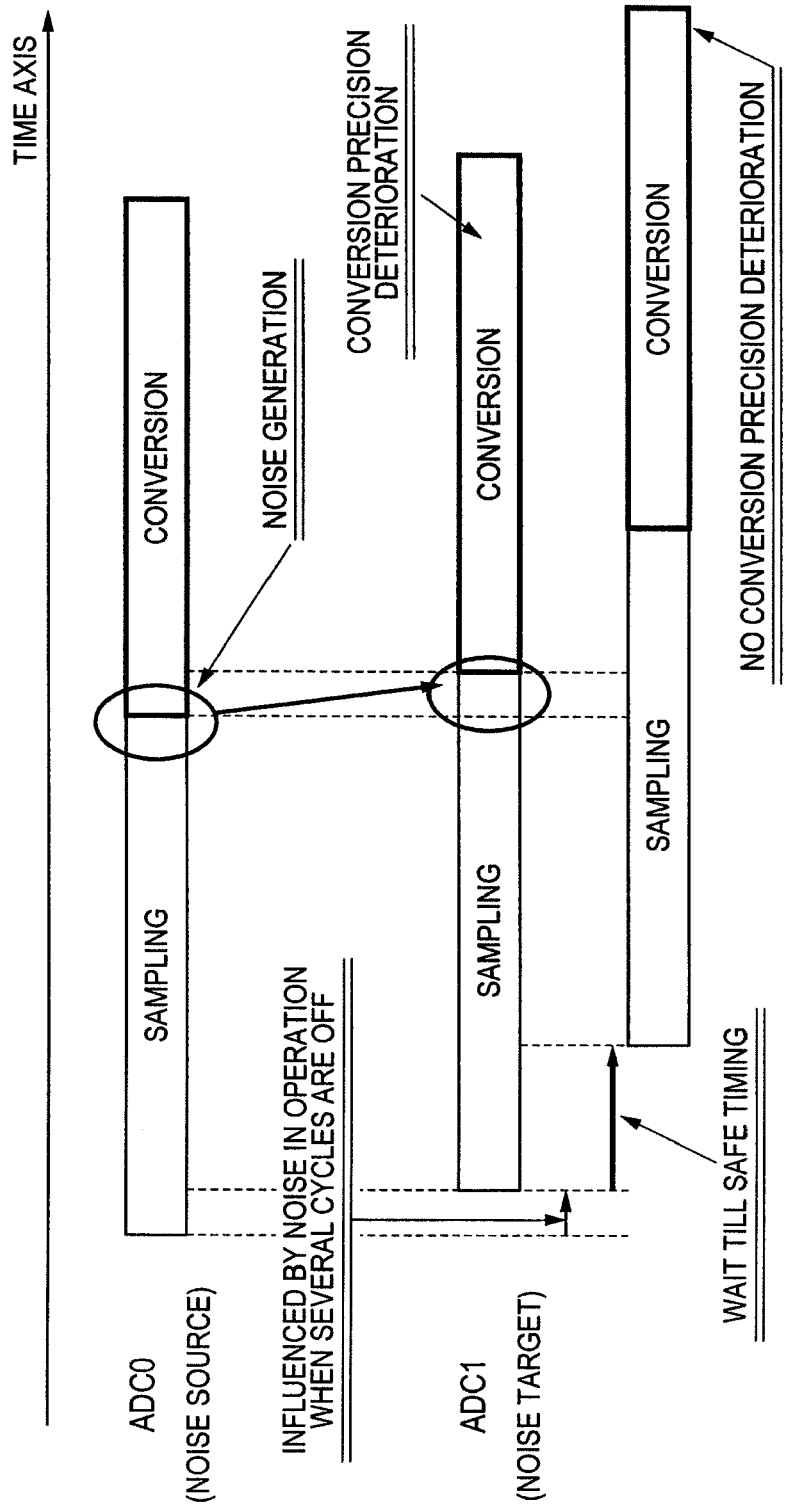
FIG. 11 is an explanatory diagram exemplifying an influence of the start of another A/D conversion operation.
Figure 12:
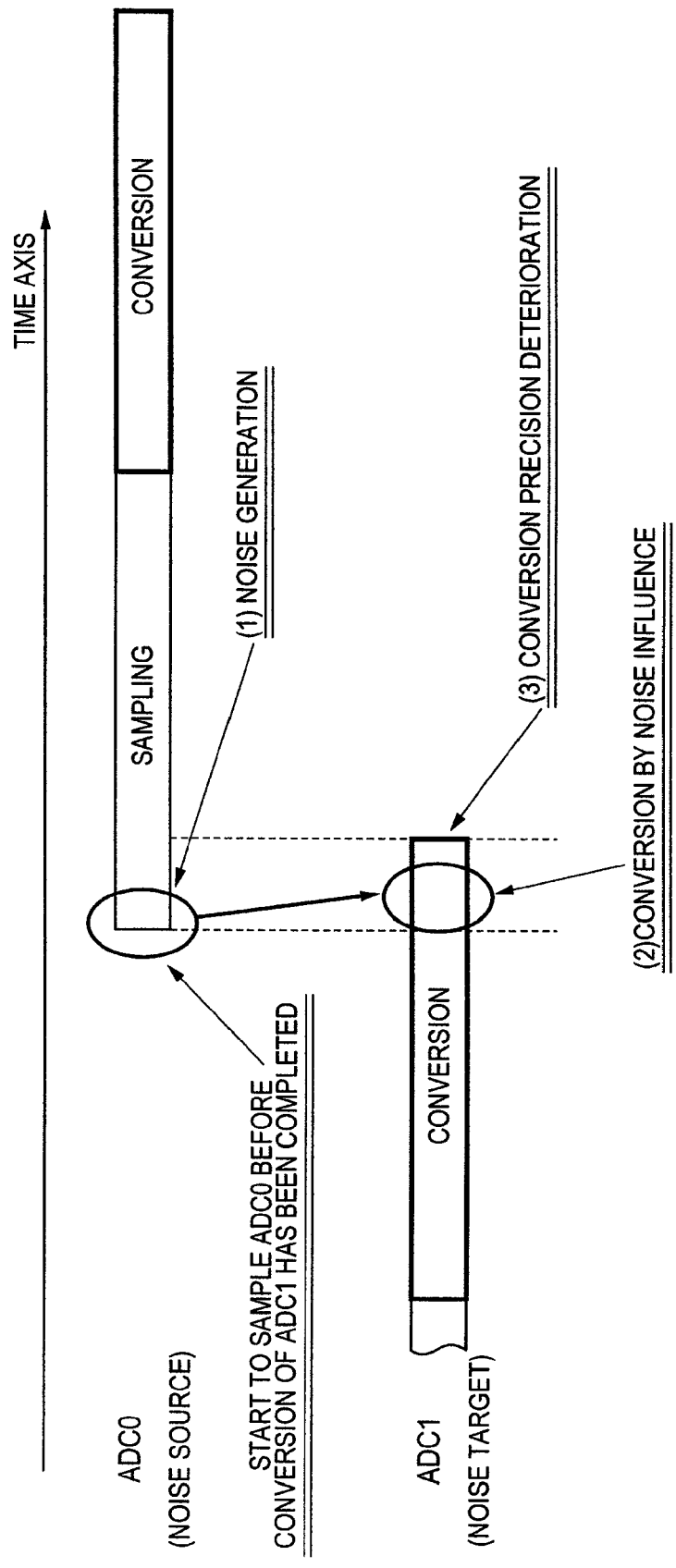
FIG. 12 is an explanatory diagram illustrating another example of the influence of the start of another A/D conversion operation.

FIGS. 11 and 12 exemplify an influence of the A/D conversion operation start. FIG. 11 exemplifies a state in which the operation of an A/D converter ADC1 starts immediately after an A/D converter ADC0 has started the conversion operation. A large switching noise may be generated when each of the A/D converters shifts from the sampling operation to the conversion operation. The A/D converter is influenced by the noise at the time of completing the sampling operation, and the sampling operation for correcting the noise can be no longer continued. Finally, the conversion precision may be greatly deteriorated. Referring to FIG. 12, a large switching noise may be generated when the sampling operation starts. The A/D converter is influenced by the noise at the time of terminating the conversion operation with the result that the conversion operation for correcting the noise can be no longer continued. Finally, the conversion precision may be greatly deteriorated.

Figure 13:
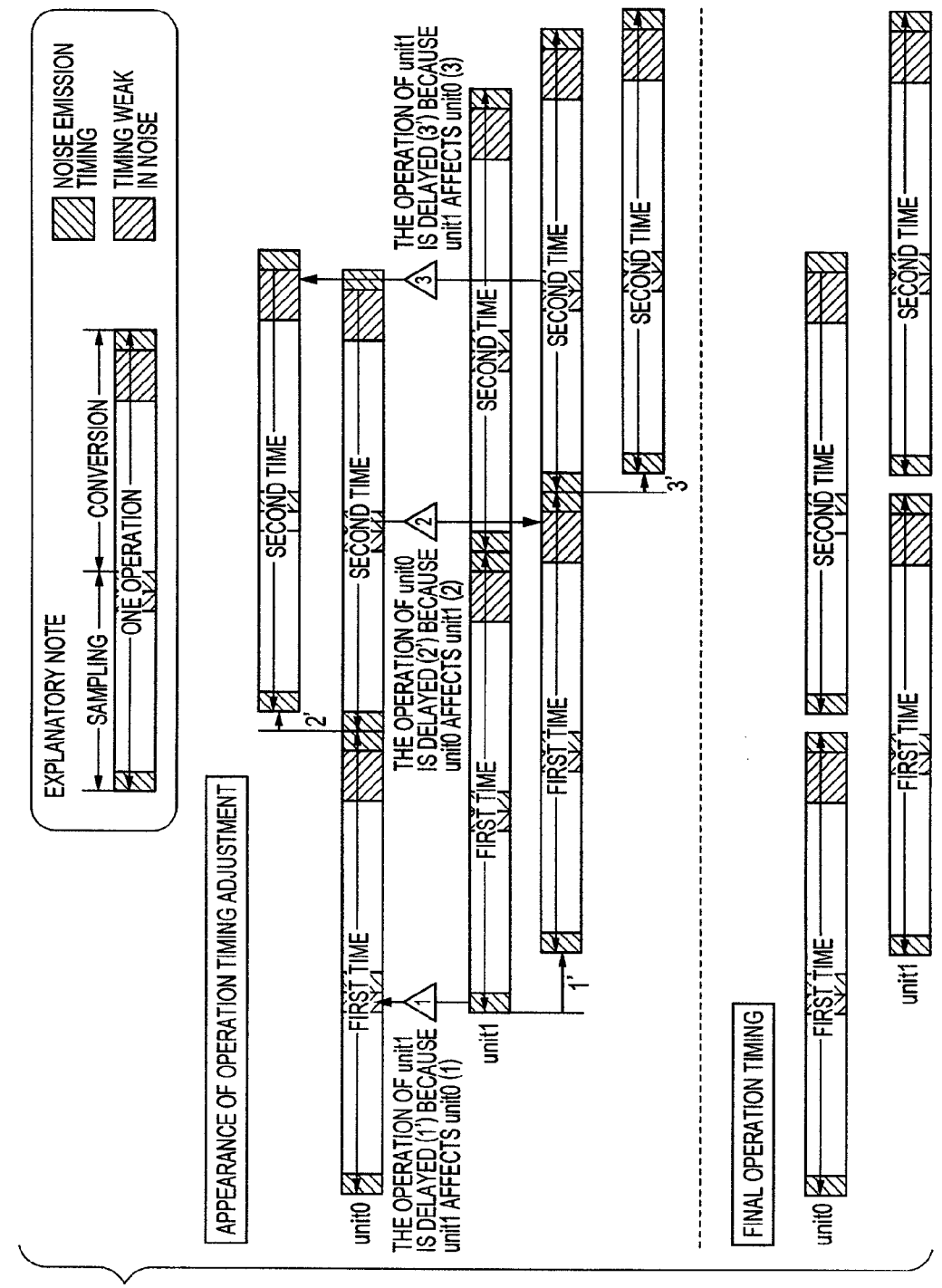
FIG. 13 is a timing chart showing an example of timing adjustment for operating two A/D converters in parallel when noise in the case of FIGS. 11 and 12 is taken into consideration.

FIG. 13 illustrates a timing adjustment example in which two A/D converters operate in parallel taking the noise in the case of FIGS. 11 and 12 into consideration. Let us consider the A/D converter of unit 0 and the A/D converter of unit 1. A given state is delayed for starting the A/D converter of unit 1 after the A/D converter of unit 0 has operated. Also, the given state is delayed for again starting the A/D converter of unit 0 after the A/D converter of unit 1 has started. Further, the given state is delayed for again starting the A/D converter of unit 1 after the A/D converter of unit 0 has started. As a result, the noise emission timing caused by the A/D conversion operation can be adjusted so as not to overlap with timing weak in the noise.

Figure 14:
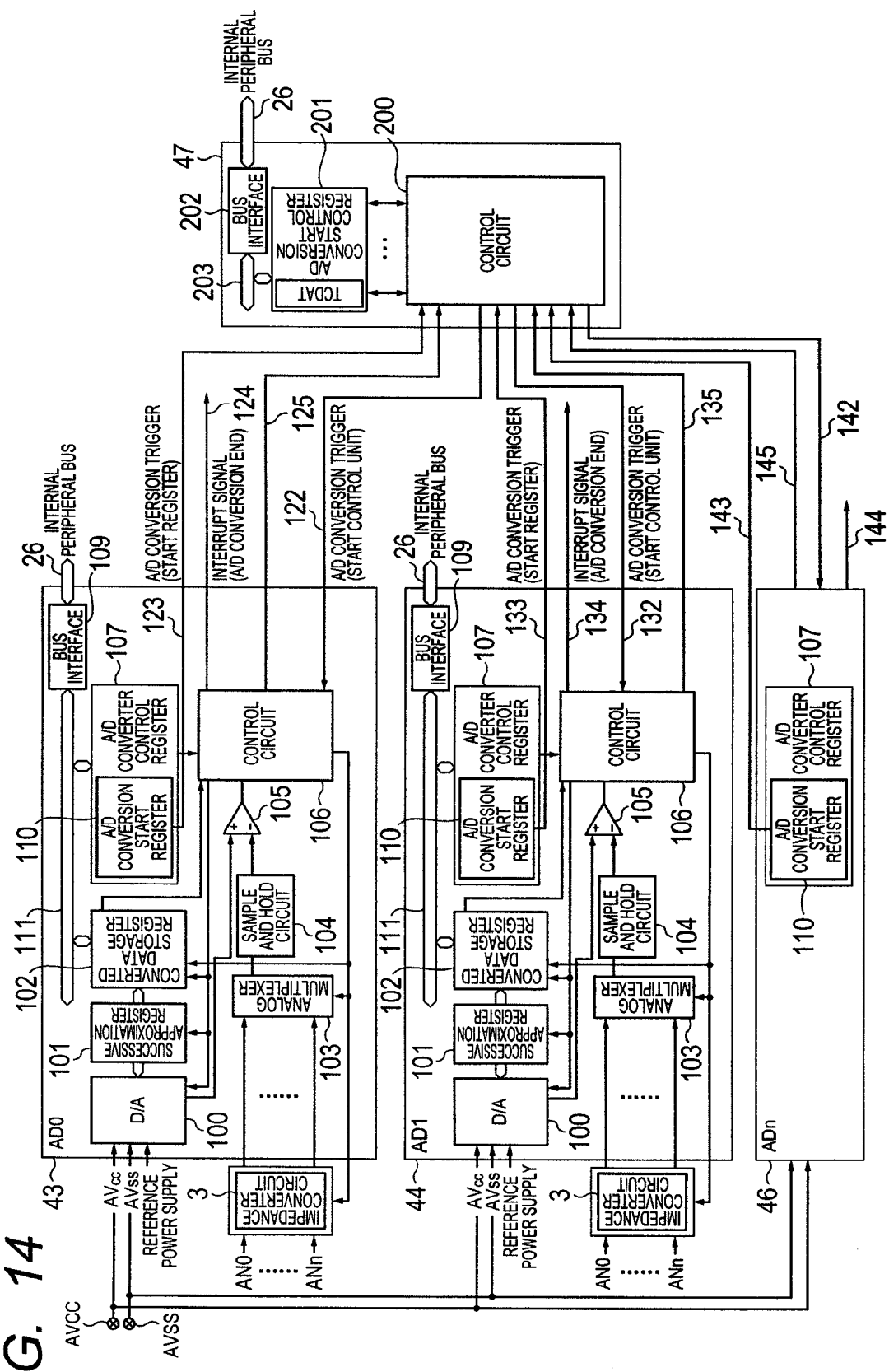
FIG. 14 is a block diagram illustrating an example in which no conversion trigger signal is supplied from the external of the A/D converter in the microcomputer of FIG. 1.

FIG. 14 illustrates an example in which no conversion trigger signal is supplied from the external of each A/D converter. Differences from FIG. 2 reside in that the conversion trigger signals 120, 121, 130, 131, 140, and 141 are not provided, and the multiplexer 108 is not provided in each of the A/D converters 43, 44, and 46. The other configurations are identical with those in FIG. 2. The conversion trigger for the A/D converter is conducted by setting the register 110 through the CPU 13.

The above-mentioned embodiment has the following advantages.

The timing control data is used to specify timing at which one A/D converter undergoes influence among all of timing at which the other A/D converters start operation out of synchronization during the operation of one A/D converter. As a result, the noise generated in one A/D converter that operates out of synchronization can be prevented from going around to the other A/D converters through the analog power supply channel. The parallel operation mode of the A/D converters having the common analog power supply can be determined according to the timing control data.

Since the memory circuit 201 that rewritably stores the timing control data is provided, it is easy to use the timing control data matching the operation mode of the A/D converter.

Since the calibration function is provided, the timing control data suitable for the actual equipment to which the microcomputer is applied can be easily obtained.

Embodiment 2

Microcomputer

Figure 15:
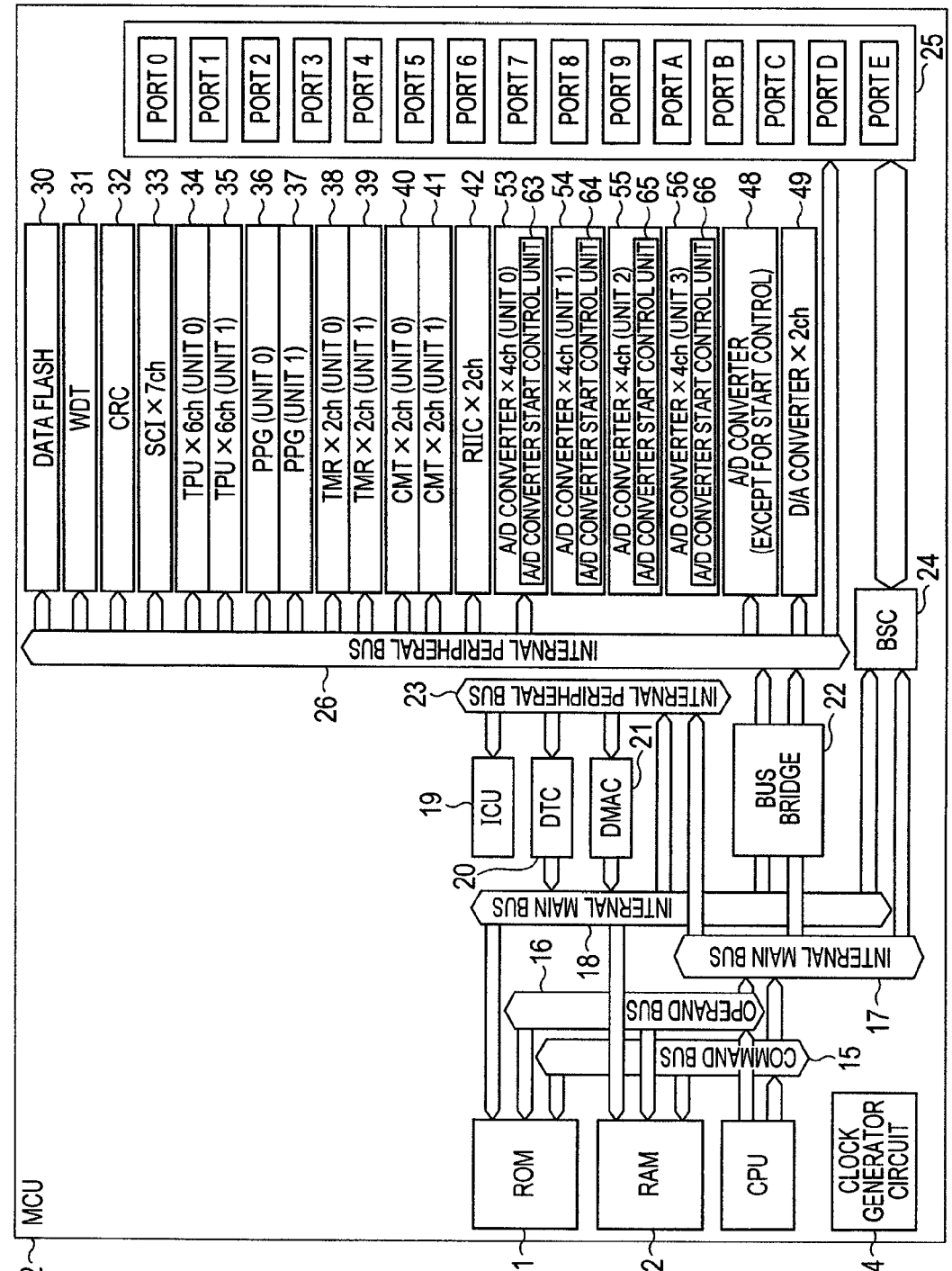
FIG. 15 is a block diagram exemplifying the configuration of a microcomputer according to a second embodiment of the present invention.

FIG. 15 exemplifies a configuration of a microcomputer according to Embodiment 2. Although not particularly limited, a microcomputer (MCU) 2 illustrated in FIG. 15 is formed on one semiconductor substrate such as a single crystal silicon as a semiconductor device through a semiconductor process technology for a complementary MOS integrated circuit or the like. A difference from the microcomputer illustrated in FIG. 1 resides in that the A/D converters 43, 44, and 46, and the A/D converter start control unit 47 are replaced with A/D converters 53 to 56 having A/D converter start control units 63 to 66, respectively. The same configurations as those in FIG. 2 are denoted by identical reference symbols, and their detailed description will be omitted.

<<A/D Conversion Start Timing Control>>

Figure 16:
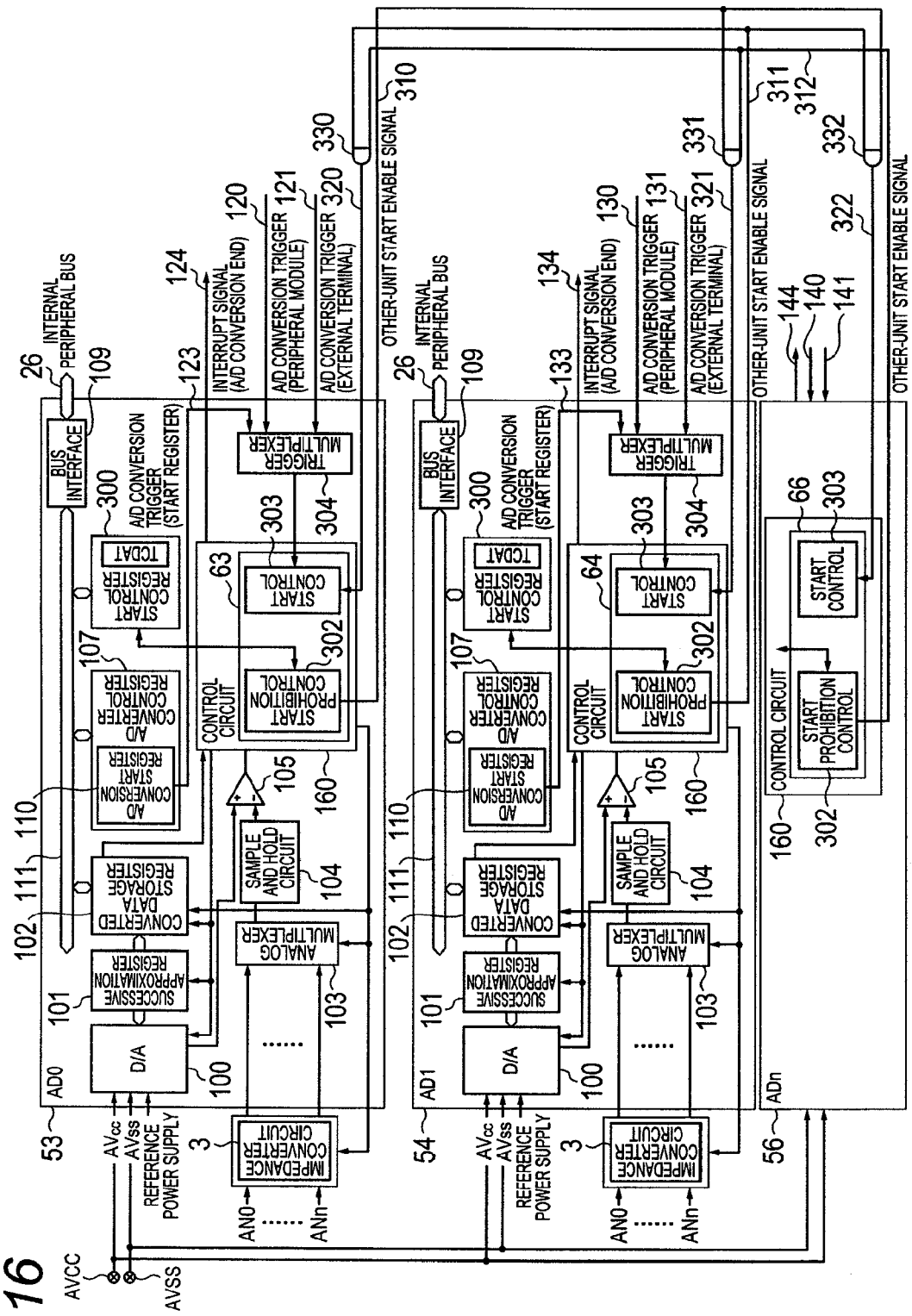
FIG. 16 is a block diagram exemplifying the details of A/D converters each having an A/D converter start control unit in the microcomputer of FIG. 15.

FIG. 16 exemplifies the details of the A/D converters 53 to 56 having the A/D converter start control units 63 to 66, respectively. Although not particularly limited, for facilitation of understanding the following description, it is assumed that three A/D converters 53, 54, and 56 are essentially provided.

Each of the A/D converter start control units 63, 64, and 66 as the respective timing control circuits controls the start timing of the A/D conversion operation autonomously with reference to the states of the other A/D converters, in response to a start request for the analog operation which is supplied through a trigger multiplexer 304. In short, each of the A/D converter start control units 63 to 66 generates and outputs a timing control signal 310, 311, or 312 for indicating an interval for prohibiting or permitting the analog operation start of the other A/D converters in the operation cycle of the subject A/D converter during the A/D conversion operation thereof on the basis of the timing control data TCDAT. Each of the A/D converter start control units 63 to 66 also conducts control to start the operation of the analog circuit in a limited interval during which the operation start is permitted by each of the timing control signals output by the other A/D converters. With this configuration, one A/D converter is controlled in the A/D conversion operation start on the basis of the timing control data (TCDAT) that specifies the interval for suppressing the analog operation start of the one A/D converter in the analog operation cycle of the other A/D converter that has already started the A/D conversion operation. The detailed configuration for this control will be further described.

The same configurations as those in FIG. 2, which are required for the A/D conversion operation due to the successive approximation in the A/D converters 53, 54, and 56 are denoted by identical reference symbols, and their detailed description will be omitted.

The A/D conversion operation of the A/D converter 53 is instructed by the A/D conversion trigger signals 120, 121, and 123 as the start request signals. Those A/D conversion trigger signals 120, 121, and 123 are selected by the trigger multiplexer 304 according to the setting of the register 110. Likewise, the A/D conversion operation of the A/D converter 54 is instructed by the A/D conversion trigger signals 130, 131, and 133 as the start request signals. Those A/D conversion trigger signals 130, 131, and 133 are selected by the trigger multiplexer 304 according to the setting of the register 110. The same is applied to the A/D converter 56.

The respective A/D converter start control units 63, 64, and 66 are disposed in the corresponding control circuits 160. Each of the control circuits 160 has the same function as that of the control circuit 106 that controls the A/D conversion operation made by the successive approximation, and has the A/D conversion start control function. The timing control data TCDAT used by the A/D converter start control units 63, 64, and 66 is held by a start control register 300. The start control register 300 is coupled to the internal peripheral bus 26 through the module data bus 111 and the bus interface 109, and the control data is set by the CPU 13.

The timing control data TCDAT is data for specifying the interval during which the A/D conversion operation is indispensably affected by noise propagated through the analog power supply channel when the A/D conversion operation of the other A/D converters starts during an A/D conversion cycle, for example, when the A/D conversion cycle including sampling of the A/D converters and conversion caused by successive approximation is made to correspond to count cycles of 1 to 20. For example, in an example of FIG. 4, the timing control data TCDAT is data for designating the count cycles 1 to 4 and the count cycles 16 to 20.

The A/D converter control unit 63 has a start prohibition control unit 302 and a start control unit 303. The start control unit 303 starts the A/D conversion operation upon supply of the A/D conversion trigger signal from the trigger multiplexer 304 under the condition where a self-converter start permission signal 320 is enabled.

The start prohibition control unit 302 is configured by, for example, a timer counter in which the timing control data TCDAT has been preset. When the A/D conversion cycle starts, the start prohibition control unit 302 starts the timer counter operation from a value 0, and generates an other-converter start permission signal 310 of a waveform set to a low level in the interval of the timer count value designated by the timing control data TCDAT. Then, upon receiving an instruction to terminate the A/D conversion cycle, the start prohibition control unit 302 returns the timer count value to the value 0 to stop the timer counter operation. Accordingly, the outputs 310, 311, and 312 of the start prohibition control units 302 in the respective A/D converters 53, 54, and 56 prohibit the operation of the other A/D converters in the period of the low level, that is, permits the operation of the other A/D converters in the period of the high level.

The self-converter start permission signal 320 is obtained by ANDing the other-converter start permission signals 311 and 312 of the other A/D converters 54 and 56 by an AND gate 330. Likewise, the self-converter start permission signal 321 is obtained by ANDing the other-converter start permission signals 310 and 312 of the other A/D converters 53 and 56 by an AND gate 331, and the self-converter start permission signal 322 is obtained by ANDing the other-converter start permission signals 310 and 311 of the other A/D converters 53 and 54 by an AND gate 332.

Accordingly, the self-converter start signal 320 is set in a conversion enable state at timing when noise indispensable in the operation of the other A/D converters 54 and 56 is not generated. Likewise, the self-converter start signal 321 is set in a conversion enable state at timing when noise indispensable in the operation of the other A/D converters 53 and 56 is not generated, and the self-converter start signal 322 is set in a conversion enable state at timing when noise indispensable in the operation of the other A/D converters 53 and 54 is not generated.

<<Timing Control by A/D Conversion State>>

The timing control of the A/D conversion start is not limited to a case using the timer counter, but can be controlled by using the A/D conversion state. For example, the start prohibition control unit 302 is configured by not the timer counter but the comparator (COMP), and the state No. of the A/D conversion state is held instead of the count value made by the timer counter in the timing control data TCDAT. The start prohibition control unit 302 compares the state No. in the started A/D conversion operation with the state No. of the timing control data TCDAT, and generates a comparison result signal of a waveform set in the low level in the matched state. The other configurations are identical with those in the case of FIG. 16, and their detailed description will be omitted. The same advantages as those in the case using the timer counter are obtained in the case employing the timing control by the A/D conversion state.

<<Calibration>>

Figure 17:
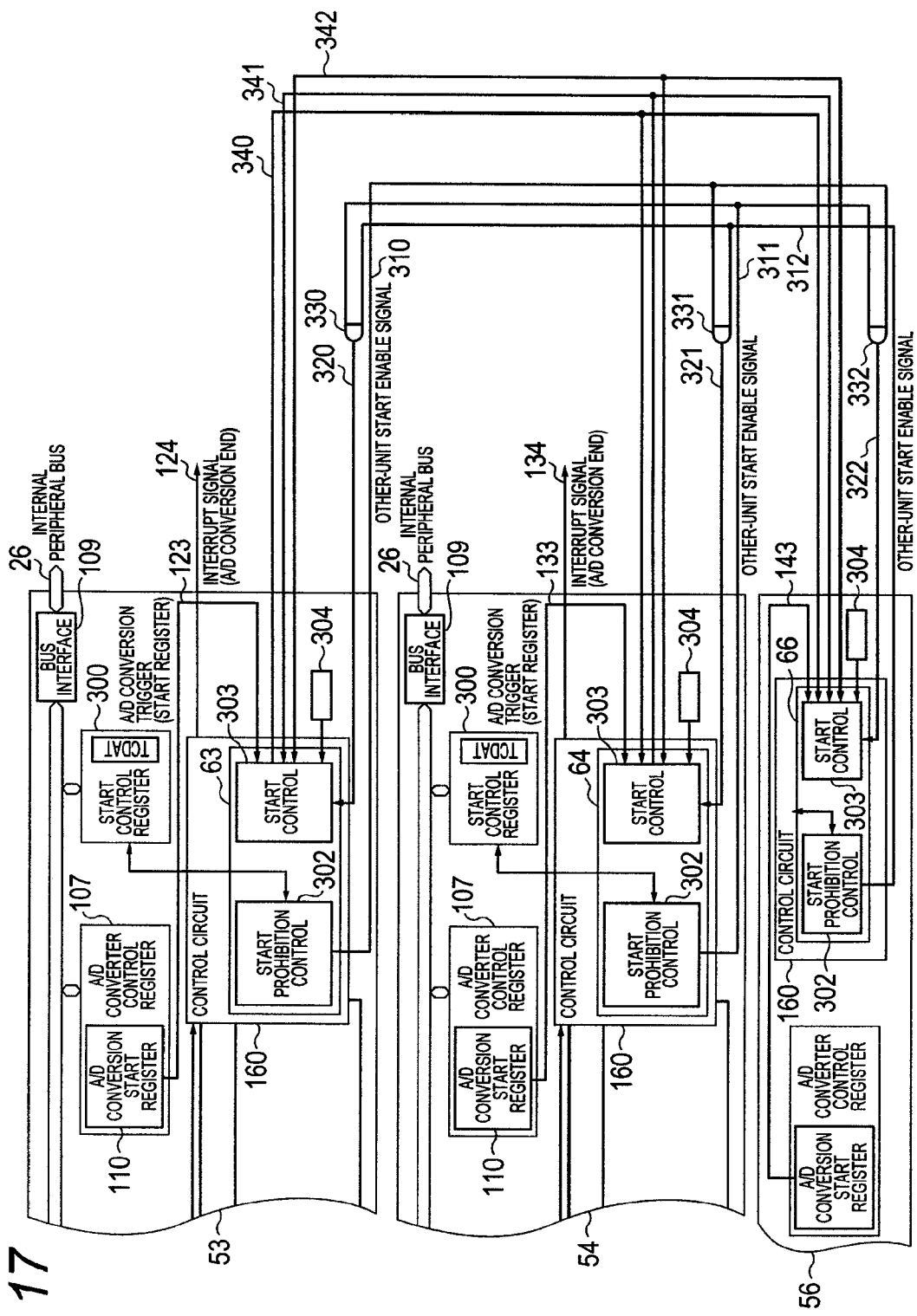
FIG. 17 is a block diagram showing a start signal (omitted in FIG. 16) for allowing one A/D converter to start the conversion operation of another A/D converter in calibration operation.

The timing control data TCDAT can be generated through simulation with the use of the microcomputer and the design data of the A/D converters. In this embodiment, the A/D converter start control units 63, 64, and 66 as the timing control circuits has a function of controlling the calibration operation for generating the timing control data. The calibration operation repeats the operation of accumulating errors between a target value and the operation results made by one A/D converter when the operation of the other A/D converters starts after the operation of the one A/D converter has started while sequentially shifting the start timing of the other A/D converters. Then, the calibration operation obtains an interval of the start timing causing a given error according to a relationship between plural errors obtained by the accumulating operation and corresponding start timing. Then, the calibration operation generates timing control data having the obtained interval as an interval for prohibiting the A/D conversion operation start. In the calibration operation, the start signals for allowing one A/D converter to start the conversion operation of the other A/D converters are omitted from FIG. 16, and the start signals are indicated by reference numerals 341 and 342 in FIG. 17. The start signal for the A/D converter 55 is omitted from the drawings. Reference numeral 340 is a start signal for instructing the A/D conversion operation start to the respective other A/D converters 54 and 56 by the A/D converter start control unit 63, individually, reference numeral 341 is a start signal for instructing the A/D conversion operation start to the respective other A/D converters 53 and 56 by the A/D converter start control unit 64, individually, and reference numeral 342 is a start signal for instructing the A/D conversion operation start to the respective other A/D converters 53 and 54 by the A/D converter start control unit 66, individually.

The calibration operation is controlled in the same manner described with reference to FIG. 9. For example, when an influence on the A/D converter 53 (unit 0) that is operating is considered, an influence of the other A/D converter 54, an influence of the other A/D converter 55, and an influence of the A/D converter 56 are obtained, respectively, and their obtained results are then synthesized. In more detail, when the A/D converter 53 operates, an influence when the conversion operation of the A/D converter 54 starts at the same timing in response to a start signal 340, an influence when the operation of the A/D converter 54 starts at timing where the timer count state (or the conversion state) is shifted by one in response to the start signal 340, an influence when the operation of the A/D converter 54 starts at timing where the timer count state (or the conversion state) is shifted by two in response to the start signal 340, and influences when the operation of the A/D converter 54 starts while the timer count state (or the conversion state) is shifted in the same manner until the shift of timing becomes maximum are obtained, respectively. Then, an influence of the operation of another A/D converter 55 on the A/D converter 53 is obtained, and an influence of the operation of another A/D converter 56 on the A/D converter 53 is finally obtained. Those results are ORed to obtain the timing control data for the A/D converter 53. When modes in which the respective A/D converters 53, 54, 55, and 56 are influenced by the other A/D converters are different from each other, the influences of the other A/D converters on the respective A/D converters 53, 54, 55, and 56 are measured to generate the individual timing control data for each of the A/D converters. The calibration processing made by the respective A/D converter start control units 63, 64, 65, and 66 is executed in the same procedure as that shown in the flowchart of FIG. 10, which has been described above.

The timing control data TCDAT generated by the respective A/D converter start control units 63, 64, 65, and 66 is stored in the corresponding start control registers 300. It is desirable that the start control register 300 is configured by an electrically rewritable nonvolatile memory such as a flash memory. Efforts that the calibration processing is repeated for each power off are omitted.

The microcomputer 1 has the above calibration control function with the result that the timing control data suitable for actual equipment to which a microcomputer is applied can be easily acquired.

Figure 18:
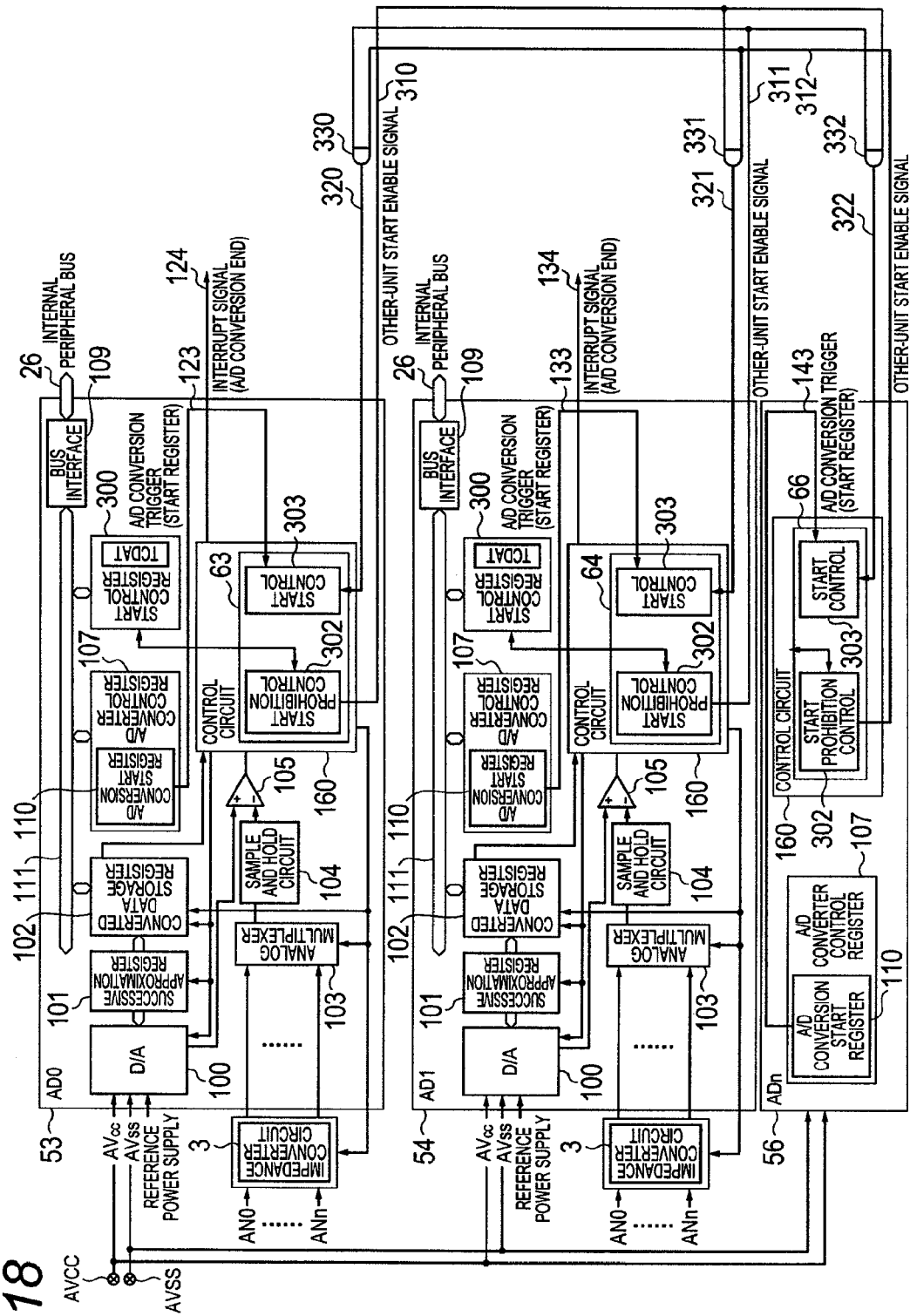
FIG. 18 is a block diagram exemplifying a case in which no conversion trigger signal is supplied from the external of the A/D converter in the microcomputer of FIG. 15.

FIG. 18 illustrates an example in which no conversion trigger signal is supplied from the external of each A/D converter. Differences from FIG. 16 reside in that the conversion trigger signals 120, 121, 130, 131, 140, and 141 are not provided, and the trigger multiplexer 304 is not provided in each of the A/D converters 53, 54, and 56. The other configurations are identical with those in FIG. 16. The conversion trigger of the A/D converters is conducted by the setting of the register 110.

The above-mentioned Embodiment 2 can also obtain the same advantages as those in Embodiment 1.

Embodiment 3

Microcomputer Applied Equipment

Figure 19:
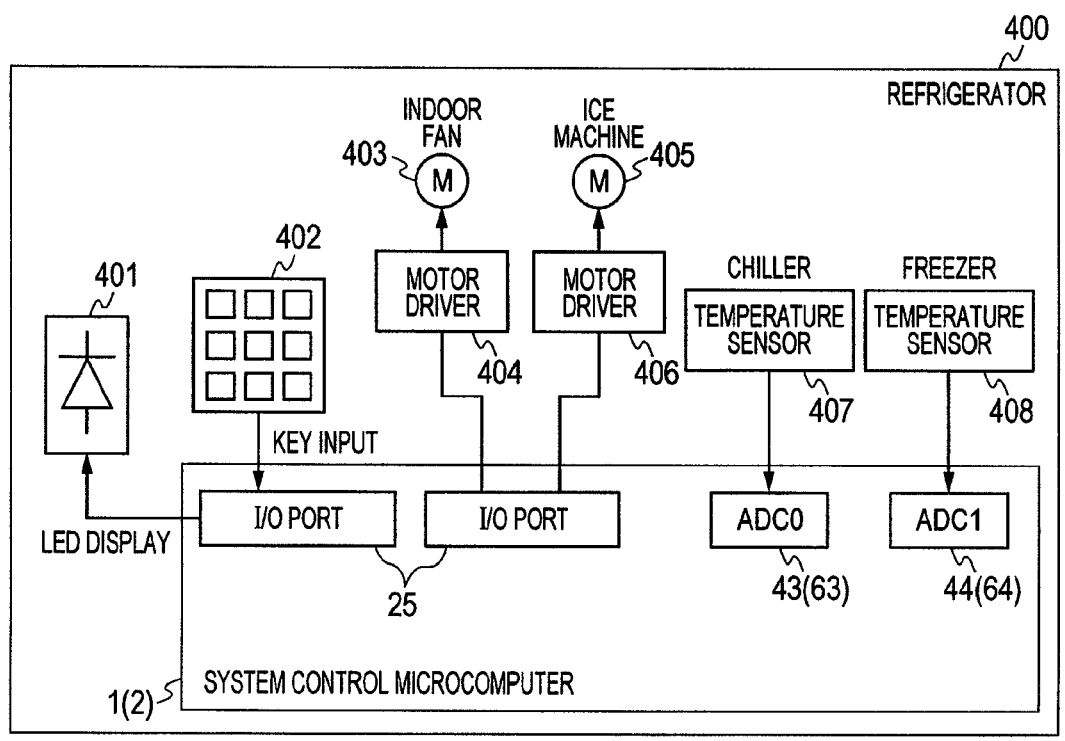
FIG. 19 is a block diagram exemplifying the configuration of a refrigerator as microcomputer applied equipment to which the microcomputer according to the first or second embodiment is applied.

FIG. 19 exemplifies a configuration of a refrigerator as microcomputer applied equipment to which the above microcomputer is applied. A refrigerator 400 has the microcomputer 1 (2) and target equipment controlled by the microcomputer 1 (2). The target equipment is, for example, an LED display panel 401, an input key 402, a motor driver 404 of a motor 403 that rotates a fan within the refrigerator, a motor driver 406 of a motor 405 that drives a freezer of the refrigerator, a temperature sensor 407 of a chiliroom, and a temperature sensor 408 of the freezing chamber. Those components are housed in a housing of the refrigerator. The LED display panel 401, the input key 402, the motor driver 404, and the motor driver 406 are coupled to a port 25 of the microcomputer 1 (2). The output of display data processed by using the CPU 13 of the microcomputer 1 (2), the input of the setting data from the input key, and the output of the drive signals to the motor drivers 404 and 406 are executed. An analog temperature detection signal is supplied to the A/D converter 43 (53) from the temperature sensor 407, and an analog temperature detection signal is supplied to the A/D converter 44 (54) from the temperature sensor 408. Under the above-mentioned timing control realized by the timing control circuit 47 (63, 64, 65, 66), it is hard for the timing control circuit 47 (63, 64, 65, 66) to be influenced by the noises caused by the A/D conversion operation start conducted after the previous A/D conversion operation in conducting the parallel A/D conversion operation. Therefore, a high precision can be maintained in temperature detection of the refrigerator and the freezer, thereby contributing to the achievement of the excellent refrigerating and freezing functions.

The invention made by the present inventors has been described above in detail with reference to the various embodiments. However, the present invention is not limited to the above embodiments, but can be variously modified without departing from the subject matter of the invention.

For example, the microcomputer is not limited to the general purpose use for control of the microcomputer incorporated equipment, but may be dedicated to processing such as encryption decrypting, image processing, sound processing, or communication processing. The on-chip circuit and the bus configuration of the microcomputer are not limited to the above embodiments, but can be appropriately altered. The number of A/D converters to be mounted can also be appropriately changed. The analog input of the A/D converters is not limited to the dedicated configuration, but may be of a common configuration. Also, one A/D converter is not limited to the configuration having the A/D conversion channels, but may be of a single channel. The A/D converter is not limited to the successive approximation type, but may be of other conversion types such as a parallel comparison type, a delta sigma type, or a double integral type. The processing of the control circuits 200 and 200*m* can be made to greatly depend on software processing. The analog voltage used for the calibration processing may be applied to the analog multiplexer from the external, or may have a reference voltage generator circuit only for the calibration operation, which generates a reference voltage to be used as the analog voltage.

Further, the analog circuit is not limited to the A/D converter, but may be configured by a D/A converter, an analog filter, or an analog signal processing circuit. The semiconductor device is not limited to the microcomputer of one chip, but may be of a multi-chip configuration, or various semiconductor integrated circuits for measurement or of the system-on-chip. The microcomputer applied equipment is not limited to the refrigerator, but can be applied to various electronic equipment regardless of consumer or industrial use.

What is claimed is:

1. A microcomputer comprising:
   an analog unit that receives and processes analog signals; and
   a processing unit,
   wherein the analog unit includes a plurality of analog circuits that can operate in parallel and are coupled to a common analog power supply terminal, and wherein analog operation start of one analog circuit is controlled on the basis of timing control data that specifies an interval for suppressing the analog operation start of the one analog circuit in an analog operation cycle of another analog circuit that has already started the analog operation,
   wherein the analog unit has a timing control circuit that controls the operation start timing of the analog circuits, and
   wherein the timing control circuit receives start request signals of the analog operation for the analog circuits, and determines the operation start timing of the other analog circuits responsive to a later start request signal with reference to the operation start timing of the analog circuit that has previously started, on the basis of timing control data.

2. The microcomputer according to claim 1, wherein the analog unit has a memory circuit that rewritably retains the timing control data.

3. The microcomputer according to claim 2,
   wherein the analog circuits include a timing control circuit that controls the start timing of the analog operation autonomously in response to the state of the other analog circuits with respect to the start request for the analog operation, and
   wherein the timing control circuit generates and outputs a timing control signal for indicating an interval for prohibiting or permitting the analog operation start of the other analog circuits in the operation cycle of the subject analog circuit during the analog operation thereof, and conducts control to start the operation of the analog circuit in a limited interval during which the operation start is permitted by each of the timing control signals output by the other analog circuits.

4. The microcomputer according to claim 3,
   wherein the timing control data is timer count data for specifying the interval for prohibiting or permitting the analog operation start of the other analog circuits in the analog operation cycle of the subject analog circuit, and
   wherein the timing control circuit includes a timer circuit that starts timer operation based on the timing control data in response to the analog operation start, and generates a timing control signal indicating the interval for prohibiting or permitting the analog operation start.

5. The microcomputer according to claim 3,
   wherein the timing control data is state identification data for specifying the interval for prohibiting or permitting the analog operation start of the other analog circuits in the analog operation cycle of the subject analog circuit according to the operation state, and
   wherein the timing control circuit discriminates whether or not the operation start of the analog circuit specified by the timing control data is permitted for each operation state of the analog circuit in response to the analog operation start, and generates the timing control signal indicating the interval for prohibiting or permitting the analog operation start according to the respective discrimination results.

6. The microcomputer according to claim 3,
   wherein the timing control circuit controls calibration operation for generating the timing control data, and
   wherein the calibration operation repeats the operation of accumulating errors between a target value and the operation results made by the subject analog circuit when the operation of the other analog circuits starts after the operation of the subject analog circuit has started while sequentially shifting the start timing of the other analog circuits, determines an interval for prohibiting the analog operation start on the basis of the interval of the start timing causing a given error according to a relationship between a plurality of errors obtained by the accumulating operation and corresponding start timing, generates the timing control data, and stores the generated timing control data in the memory circuit.

7. The microcomputer according to claim 1,
wherein the timing control circuit includes a timer circuit for discriminating an interval for suppressing the operation start of the analog circuit specified by the timing control data for each operation cycle of the analog circuit that has started the operation, and a logic circuit that suppresses the analog operation start responsive to the start request signal of the A/D conversion operation during the interval discriminated by the timer circuit, and cancels the suppression after waiting for the discrimination of deviation from the interval by the timer circuit, and
wherein the timing control data specifies the interval for suppressing the operation start of the analog circuit by count information measured by the timer circuit.

8. The microcomputer according to claim 1,
wherein the timing control circuit includes a determination circuit that identifies an operation state of the analog circuit that has started the operation, and discriminates whether or not the identified operation state coincides with an operation state for suppressing the operation start of the analog circuit specified by the timing control data, and a logic circuit that suppresses the analog operation start responsive to the start request signal of the analog operation during a period in which coincidence has been discriminated, and cancels the suppression after waiting for the discrimination of noncoincidence, and
wherein the timing control data specifies the operation state for suppressing the operation start of the analog circuit.

9. The microcomputer according to claim 1,
wherein the timing control circuit controls calibration operation for generating the timing control data, and
wherein the calibration operation repeats the operation of accumulating errors between a target value and the operation results made by one analog circuit when the operation of the other analog circuits starts after the operation of the one analog circuit has started while sequentially shifting the start timing of the other analog circuits, obtains an interval of the start timing causing a given error according to a relationship between a plurality of errors obtained by the accumulating operation and corresponding start timing, generates timing control data having the obtained interval as an interval for prohibiting the analog operation start, and stores the generated timing control data in the memory circuit.

10. A semiconductor device, comprising:
a plurality of analog circuits that can operate in parallel and are coupled to a common analog power supply terminal, and a timing control circuit that controls the operation start timing of the analog circuit,
wherein the timing control circuit receives a start request signal of the analog operation for the analog circuits, and determines the operation start timing of the other analog circuits due to a later start request signal, with reference to the operation start timing of the analog circuit that has previously started, on the basis of the timing control data.

11. The semiconductor device according to claim 10, further comprising a memory circuit that rewritably stores the timing control data.

12. The semiconductor device according to claim 11,
wherein the timing control circuit controls calibration operation for generating the timing control data, and
wherein the calibration operation repeats the operation of accumulating errors between a target value and the operation results made by one analog circuit when the operation of the other analog circuits starts after the operation of the one analog circuit has started while sequentially shifting the start timing of the other analog circuits, obtains an interval of the start timing causing a given error according to a relationship between a plurality of errors obtained by the accumulating operation and corresponding start timing, generates timing control data having the obtained interval as an interval for prohibiting the analog operation start, and stores the generated timing control data in the memory circuit.

13. The semiconductor device according to claim 10,
wherein the timing control data specifies the interval for prohibiting the analog operation start of the other analog circuits in the analog operation cycle of the subject analog circuit, and
wherein the timing control circuit suppresses the operation start of the analog circuit responsive to the later start request signal over the interval of prohibition indicated by the corresponding timing control data in the analog operation cycle of the analog circuit that has started in response to the previous start request signal.

14. The semiconductor device according to claim 13,
wherein the timing control circuit includes a timer circuit for discriminating the interval for suppressing the operation start of the analog circuit specified by the timing control data for each operation cycle of the analog circuit that has started the operation, and a logic circuit that suppresses the analog operation start responsive to the start request signal of the analog operation in the interval discriminated by the timer circuit, and cancels the suppression after waiting for the discrimination of deviation from the interval by the timer circuit.

15. The semiconductor device according to claim 14, wherein the timing control data specifies the interval for suppressing the operation start of the analog circuit according to count information measured by the timer circuit.

16. The semiconductor device according to claim 14, wherein the timing control data specifies the operation state for suppressing the operation start of the analog circuit.

17. The semiconductor according to claim 13, wherein the timing control circuit includes a determination circuit that identifies an operation state of the analog circuit that has started the operation, and discriminates whether or not the identified operation state coincides with the operation state for suppressing the operation start of the analog circuit specified by the timing control data, and a logic circuit that suppresses the analog operation start responsive to the start request signal of the analog operation during a period in which coincidence has been discriminated, and cancels the suppression after waiting for the discrimination of noncoincidence.

18. The semiconductor device according to claim 10, wherein each of the analog circuits samples the analog signal, and processes the sampled analog signal.

19. The semiconductor device according to claim 10, wherein each of the analog circuits is an A/D converter that samples the analog signal, and converts the sampled analog signal into a digital signal.

20. A semiconductor device, comprising:
a plurality of analog circuits that can operate in parallel and are coupled to a common analog power supply terminal,
wherein the analog circuits include a timing control circuit that controls the start timing of the analog operation autonomously with reference to states of the other analog circuits in response to a start request of the analog operation, and
wherein the timing control circuit generates and outputs a timing control signal for indicating an interval for prohibiting or permitting the analog operation start of the other analog circuits in the operation cycle of the subject analog circuit during the analog operation thereof, and conducts control to start the operation of the analog circuit in a limited interval during which the operation start is permitted by each of the timing control signals output by the other analog circuits.

21. The semiconductor device according to claim 20, further comprising:
a memory circuit that rewritably stores the timing control data,
wherein the timing control circuit generates the timing control signal on the basis of the timing control data.

22. The semiconductor device according to claim 21,
wherein the timing control circuit controls calibration operation for generating the timing control data, and
wherein the calibration operation repeats the operation of accumulating errors between a target value and the operation results made by the subject analog circuit when the operation of the other analog circuits starts after the operation of the subject analog circuit has started while sequentially shifting the start timing of the other analog circuits, determines the interval for prohibiting the analog operation start on the basis of the interval of the start timing causing a given error according to a relationship between a plurality of errors obtained by the accumulating operation and corresponding start timing to generate the timing control data, and stores the generated timing control data in the memory circuit.

23. The semiconductor device according to claim 20,
wherein the timing control data is timer count data for specifying the interval for prohibiting or permitting the analog operation start of the other analog circuits in the analog operation cycle of the subject analog circuit, and
wherein the timing control circuit includes a timer circuit that starts timer operation based on the timing control data in response to the analog operation start, and generates a timing control signal indicating the interval for prohibiting or permitting the analog operation start.

24. The semiconductor device according to claim 20,
wherein the timing control data is state identification data for specifying the interval for prohibiting or permitting the analog operation start of the other analog circuits in the analog operation cycle of the subject analog circuit according to the operation state, and
wherein the timing control circuit discriminates whether or not the operation start of the analog circuit specified by the timing control data is permitted for each operation state of the analog circuits in response to the analog operation start, and generates the timing control signal indicating the interval for prohibiting or permitting the analog operation start according to the respective discrimination results.

25. The semiconductor device according to claim 20, wherein the analog circuit samples an analog signal, and processes the sampled analog signal.

26. The semiconductor device according to claim 20, wherein the analog circuit is an A/D converter that samples an analog signal, and converts the sampled analog signal into a digital signal.

27. Microcomputer applied equipment, comprising:
a microcomputer; and
target equipment controlled by the microcomputer,
wherein the microcomputer includes an A/D conversion unit that receives an analog signal from the target equipment and converts the analog signal into a digital signal, and a processing unit that controls the target equipment by using a result of the conversion by the A/D conversion unit,
wherein the A/D conversion unit includes a plurality of A/D converter circuits that can operate in parallel, and are coupled to a common analog power supply terminal,
wherein one A/D converter circuit is controlled in the A/D conversion operation start on the basis of timing control data that specifies an interval for suppressing the conversion operation start of the one A/D conversion circuit in the conversion operation cycle of the other A/D conversion circuits that have already started the A/D conversion operation, and
wherein the A/D conversion unit includes a memory circuit that rewritably retains the timing control data.

28. The computer applied equipment according to claim 27,
wherein the A/D conversion unit includes a timing control circuit that controls the operation start timing of the A/D converter circuits, and
wherein the timing control circuit receives start request signals of the A/D conversion operation for the A/D converter circuits, and determines the operation start timing of the other A/D converter circuits responsive to a later start request signal with reference to the operation start timing of the A/D converter circuit that has started previously on the basis of the timing control data.

29. The microcomputer applied equipment according to claim 28,
wherein the timing control circuit includes a timer circuit for discriminating an interval for suppressing the operation start of the A/D converter circuit specified by the timing control data for each operation cycle of the A/D converter circuit that has started the operation, and a logic circuit that suppresses the A/D conversion operation start responsive to the start request signal of the A/D conversion operation in the interval discriminated by the timer circuit, and cancels the suppression after waiting for the discrimination of deviation from the interval by the timer circuit, and
wherein the timing control data specifies the interval for suppressing the operation start of the A/D converter circuit by count information measured by the timer circuit.

30. The computer applied equipment according to claim 28,
wherein the timing control circuit includes a determination circuit that identifies the operation state of the A/D converter circuit that has started the operation, and discriminates whether or not the identified operation state coincides with the operation state for suppressing the operation start of the A/D converter circuit specified by the timing control data, and a logic circuit that suppresses the A/D conversion operation start responsive to the start request signal of the A/D conversion operation in a period in which coincidence has been discriminated, and cancels the suppression after waiting for the discrimination of noncoincidence, and wherein the timing control data specifies the operation state for suppressing the operation start of the A/D converter circuit.

31. The microcomputer applied equipment according to claim 28, wherein the timing control circuit controls a calibration operation for generating the timing control data, and wherein the calibration operation repeats the operation of accumulating errors between a target value and the operation results made by one A/D converter circuit when the operation of the other analog circuits starts after the operation of the one A/D converter circuit has started while sequentially shifting the start timing of the other A/D converter circuits, obtains an interval of the start timing causing a given error according to a relationship between a plurality of errors obtained by the accumulating operation and corresponding start timing, generates timing control data having the obtained interval as an interval for prohibiting the A/D conversion operation start, and stores the generated timing control data in the memory circuit.

32. The microcomputer applied equipment according to claim 27, wherein the A/D converter circuits includes a timing control circuit that controls the start timing of the A/D conversion operation autonomously with reference to the state of the other A/D converter circuits in response to the start request for the A/D conversion operation, and wherein the timing control circuit generates and outputs a timing control signal for indicating an interval for prohibiting or permitting the A/D conversion operation start of the other A/D converter circuits in the operation cycle of the subject A/D converter circuit during the A/D conversion operation thereof, and conducts control to start the operation of the A/D converter circuit in a limited interval during which the operation start is permitted by each of the timing control signals output by the other analog circuits.

33. The microcomputer applied equipment according to claim 32, wherein the timing control data is timer count data for specifying the interval for prohibiting or permitting the A/D conversion operation start of the other A/D converter circuits in the A/D conversion operation cycle of the subject A/D converter circuit, and wherein the timing control circuit includes a timer circuit that starts timer operation based on the timing control data in response to the A/D conversion operation start, and generates a timing control signal indicating the interval for prohibiting or permitting the A/D conversion operation start.

34. The microcomputer applied equipment according to claim 32, wherein the timing control data is state identification data for specifying the interval for prohibiting or permitting the A/D conversion operation start of the other A/D converter circuits in the A/D conversion operation cycle of the subject A/D converter circuit according to the operation state, and wherein the timing control circuit discriminates whether or not the operation start of the A/D converter circuit specified by the timing control data is permitted for each operation state of the A/D converter circuits in response to the A/D conversion operation start, and generates the timing control signal indicating the interval for prohibiting or permitting the A/D conversion operation start according to the respective discrimination results.

35. The microcomputer applied equipment according to claim 32, wherein the timing control circuit controls calibration operation for generating the timing control data, and wherein the calibration operation repeats the operation of accumulating errors between a target value and the operation results made by the subject A/D converter circuit when the operation of the other A/D converter circuits starts after the operation of the subject A/D converter circuit has started while sequentially shifting the start timing of the other A/D converter circuits, determines an interval for prohibiting the A/D conversion operation start on the basis of the interval of the start timing causing a given error according to a relationship between a plurality of errors obtained by the accumulating operation and corresponding start timing, generates the timing control data, and stores the generated timing control data in the memory circuit.

* * * * *